(12) United States Patent
Deng et al.

(10) Patent No.: US 11,830,754 B2
(45) Date of Patent: Nov. 28, 2023

(54) SEMICONDUCTOR PROCESSING METHOD AND APPARATUS

(71) Applicant: Taiwan Semiconductor Manufacturing Co., Ltd., Hsinchu (TW)

(72) Inventors: Shang-Shiuan Deng, Hsinchu (TW); Fan-Chi Lin, Hsinchu (TW); Chueh-Chi Kuo, Hsinchu (TW); Li-Jui Chen, Hsinchu (TW); Heng-Hsin Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 117 days.

(21) Appl. No.: 17/477,450

(22) Filed: Sep. 16, 2021

(65) Prior Publication Data

US 2022/0310431 A1 Sep. 29, 2022

Related U.S. Application Data

(60) Provisional application No. 63/166,460, filed on Mar. 26, 2021.

(51) Int. Cl.
*H01L 21/683* (2006.01)
*H01L 21/687* (2006.01)

(52) U.S. Cl.
CPC .... *H01L 21/6833* (2013.01); *H01L 21/68721* (2013.01)

(58) Field of Classification Search
CPC .................. H01L 21/6833; H01L 21/68721
See application file for complete search history.

(56) References Cited

U.S. PATENT DOCUMENTS

| | | | | |
|---|---|---|---|---|
| 4,692,836 | A * | 9/1987 | Suzuki | H01L 21/6831 279/128 |
| 6,487,063 | B1 * | 11/2002 | Nakasuji | H02N 13/00 361/234 |
| 7,199,994 | B1 * | 4/2007 | Levinson | G03F 7/70708 361/233 |
| 8,497,980 | B2 * | 7/2013 | Yamamoto | G03F 7/70708 355/72 |
| 2014/0001154 | A1 * | 1/2014 | Sato | H01J 37/32577 156/345.52 |
| 2019/0319555 | A1 * | 10/2019 | Sasaki | H01L 21/67253 |

* cited by examiner

*Primary Examiner* — Scott Bauer
(74) *Attorney, Agent, or Firm* — SEED IP LAW GROUP

(57) ABSTRACT

A method includes: positioning a wafer on an electrostatic chuck of an apparatus; and securing the wafer to the electrostatic chuck by: securing a first wafer region of the wafer to a first chuck region of the electrostatic chuck by applying a first voltage at a first time. The method further includes securing a second wafer region of the wafer to a second chuck region of the electrostatic chuck by applying a second voltage at a second time different from the first time; and processing the wafer by the apparatus while the wafer is secured to the electrostatic chuck.

20 Claims, 19 Drawing Sheets

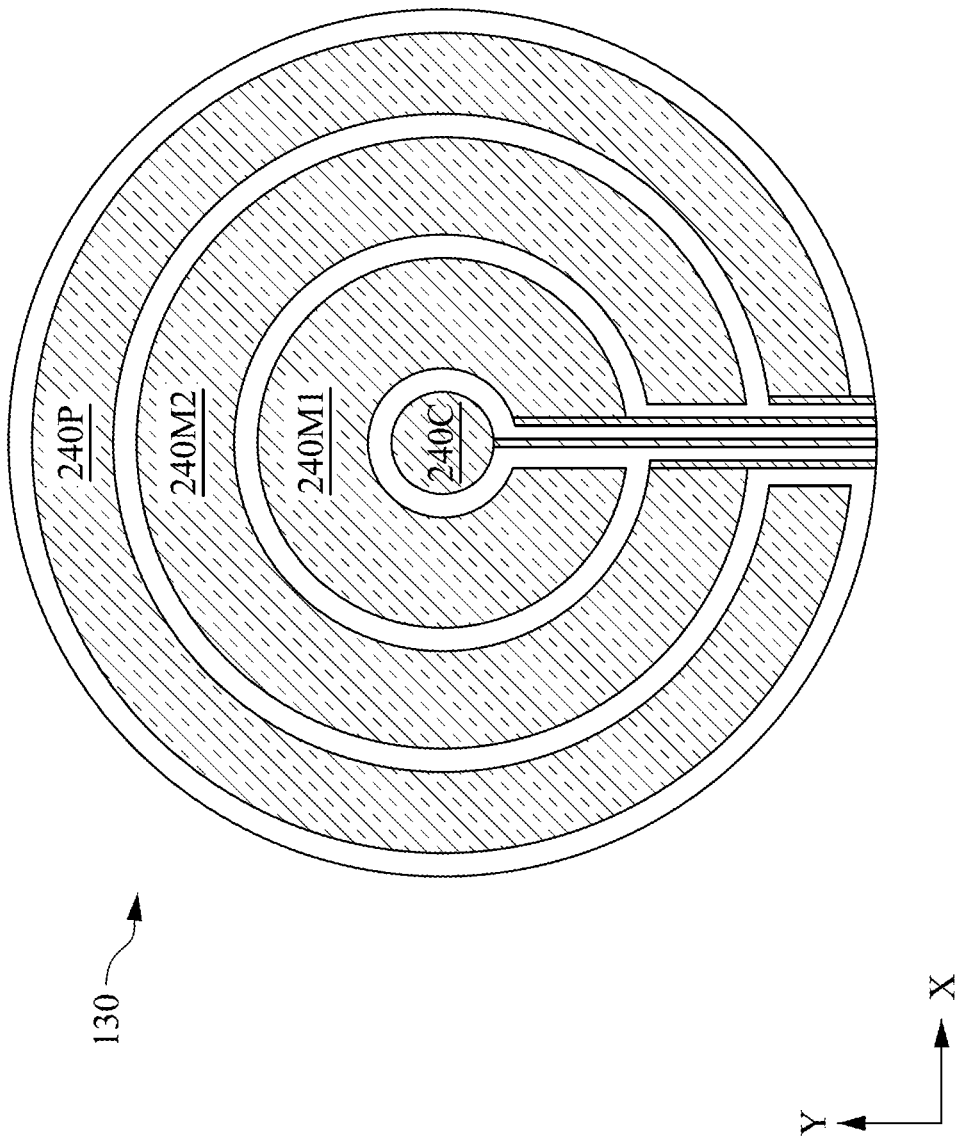

SEMICONDUCTOR PROCESSING METHOD AND APPARATUS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2I are views of an electrostatic chuck of the semiconductor processing apparatus in accordance with various embodiments.

DETAILED DESCRIPTION

Figure 1:
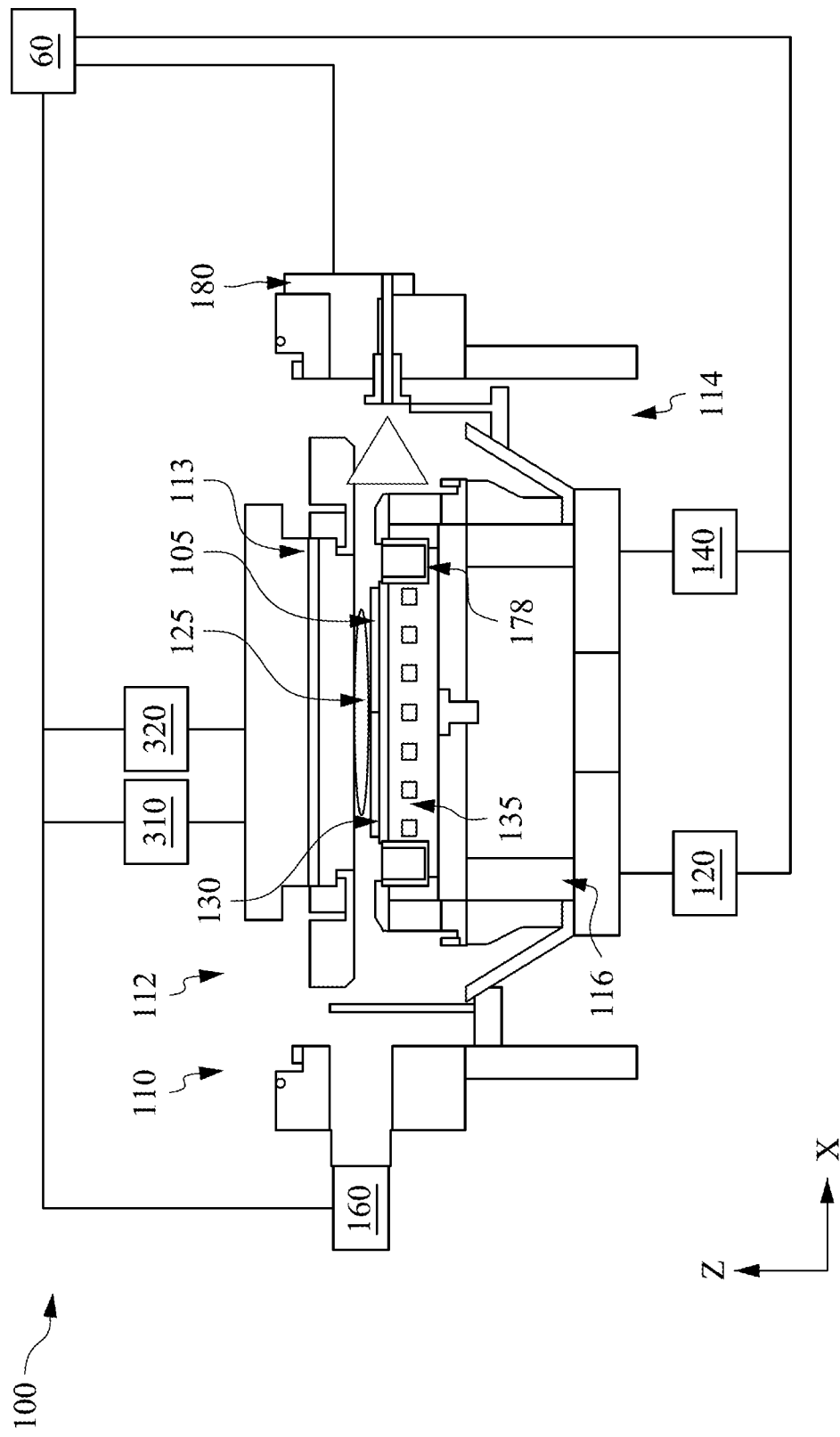
FIG. 1 is a view of a semiconductor processing apparatus according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms such as "about," "roughly," "substantially," and the like may be used herein for ease of description. A person having ordinary skill in the art will be able to understand and derive meanings for such terms. For example, "about" may indicate variation in a dimension of 20%, 10%, 5% or the like, but other values may be used when appropriate. A large feature, such as the longest dimension of a semiconductor fin may have variation less than 5%, whereas a very small feature, such as thickness of an interfacial layer may have variation of as much as 50%, and both types of variation may be represented by the term "about." "Substantially" is generally more stringent than "about," such that variation of 10%, 5% or less may be appropriate, without limit thereto. A feature that is "substantially planar" may have variation from a straight line that is within 10% or less. A material with a "substantially constant concentration" may have variation of concentration along one or more dimensions that is within 5% or less. Again, a person having ordinary skill in the art will be able to understand and derive appropriate meanings for such terms based on knowledge of the industry, current fabrication techniques, and the like.

Semiconductor fabrication generally involves the formation of electronic circuits by performing multiple depositions, etchings, annealings, and/or implantations of material layers, whereby a stack structure including many semiconductor devices and interconnects between is formed. Dimension scaling (down) is one technique employed to fit ever greater numbers of semiconductor devices in the same area. However, dimension scaling is increasingly difficult in advanced technology nodes.

A semiconductor wafer (or simply, "wafer") may be secured in place by an electrostatic chuck in many semiconductor fabrication processes. If the semiconductor wafer is clamped by electrostatic force on the electrostatic chuck in a single stage, the entire semiconductor wafer is clamped simultaneously. If the semiconductor wafer is not fully extended on the electrostatic chuck during the clamping process, stress concentration may be induced on the clamped semiconductor wafer, increasing friction between the semiconductor wafer and the electrostatic chuck. In some instances, the friction may be partially caused by, or aggravated by, warpage (or "bending") of the semiconductor wafer. For example, if the semiconductor wafer bends down toward the electrostatic chuck at its periphery, a peripheral region of the semiconductor wafer may scrape against the electrostatic chuck as the energized to clamp the semiconductor wafer. By gradually applying the electrostatic force in a staggered manner over the area of the semiconductor wafer and the electrostatic chuck, the friction may be decreased between the semiconductor wafer and the electrostatic chuck.

In embodiments of the present disclosure, the electrostatic chuck clamps the semiconductor wafer in at least two stages. As such, the wafer can be fully extended on the electrostatic chuck (e.g., from center to edge). By this staged clamping process, stress concentration of the semiconductor wafer and contamination can both be reduced.

FIG. 1 is a schematic view of a semiconductor processing apparatus 100, according to various embodiments of the disclosure. In some embodiments, the semiconductor processing apparatus 100 is configured for performing etching, deposition, or other suitable process. As shown in FIG. 1, the semiconductor processing apparatus 100 includes a process chamber 110, and a source of radio frequency (RF) power 120 configured to provide RF power in the process chamber 110. The semiconductor processing apparatus 100 also includes an electrostatic chuck 130 within the process chamber 110, and the electrostatic chuck 130 is configured to receive and secure a wafer 105. The semiconductor processing apparatus 100 also includes a chuck electrode 135, and a source of direct current (DC) power 140 connected to the chuck electrode 135. The source of DC power 140 is configured to provide power to the chuck electrode 135, and is described in greater detail with reference to FIG. 5. The semiconductor processing apparatus 100 also includes a gas source 310 configured to introduce process and/or carrier gases into the process chamber 110. The semiconductor processing apparatus 100 further includes a flow verification unit 320 configured to measure and/or verify flow rate of the process and/or carrier gases into the process chamber 110. In some embodiments, the flow verification unit 320 is a manometer. In some embodiments, the flow verification unit 320 is in fluidic communication with the process chamber 110.

In some embodiments, the semiconductor processing apparatus 100 is a plasma etching apparatus. In some embodiments, the semiconductor processing apparatus 100 is any plasma etching or dry etching tool that produces a plasma from a process gas, typically oxygen, chlorine-bearing gas, or fluorine-bearing gas, and uses a radio frequency electric field. In some embodiments, the semiconductor processing apparatus 100 is an ion-beam etcher, reactive ion etcher, or the like. In other embodiments, instead of an etching apparatus, the semiconductor processing apparatus 100 is a plasma deposition apparatus, such as a plasma-enhanced atomic layer deposition (PEALD) apparatus or the like. The plasma etching apparatus and the plasma deposition apparatus may be collectively referred to as plasma processing apparatuses.

In some embodiments, the wafer 105 includes a single crystalline semiconductor layer on at least its surface. In some embodiments, the wafer 105 includes a single crystalline semiconductor material such as, but not limited to Si, Ge, SiGe, GaAs, InSb, GaP, GaSb, InAlAs, InGaAs, GaSbP, GaAsSb, and InP. In some embodiments, the wafer 105 is made of Si. In some embodiments, the wafer 105 is a silicon wafer. In some embodiments, the wafer 105 is a semiconductor-on-insulator substrate fabricated using separation by implantation of oxygen (SIMOX), wafer bonding, and/or other suitable methods, such as a silicon-on-insulator (SOI) substrate, a silicon germanium-on-insulator (SGOI) substrate, or a germanium-on-insulator (GOI) substrate. In some embodiments, the wafer 105 is a Si wafer having a mirror polished surface on one side or both sides. In some embodiments, the wafer 105 includes one or more integrated circuit (IC) dies in an intermediate (unfinished) stage of fabrication, such that plasma etching or deposition is performed on at least a topmost layer of each of the IC dies by the semiconductor processing apparatus 100.

In some embodiments, the process chamber 110 includes an upper portion 112 and a lower portion 114, which may include at least one conductive material, such as aluminum, as well as other non-conductive or semiconductive materials. The upper portion 112 includes an upper electrode 113, in some embodiments. In some embodiments, the lower portion 114 includes an insulating ceramic frame 116 and includes the electrostatic chuck 130 within the insulating ceramic frame 116. For example, the electrostatic chuck 130 is disposed within the insulating ceramic frame 116 within the lower portion 114 of the process chamber 110, as shown in FIG. 1. In some embodiments, the electrostatic chuck 130 includes a conductive sheet, which serves as the chuck electrode 135. In some embodiments, the conductive sheet includes at least two sheet portions which are electrically isolated from each other. As shown in FIG. 1, the chuck electrode 135 is connected to the source of DC power 140. When a DC voltage from the source of DC power 140 is applied to the chuck electrode 135 of the electrostatic chuck 130 having the wafer 105 disposed thereon, a Coulomb force is generated between the wafer 105 and the chuck electrode 135. The Coulomb force attracts and holds the wafer 105 on the electrostatic chuck 130 until the application of the DC voltage from the source of DC power 140 is discontinued. In some embodiments, at least one DC voltage is applied to the at least two sheet portions of the chuck electrode 135 by the source of DC power 140, which is described with reference to FIGS. 2A-4B.

In some embodiments, in order to improve the heat transfer between the wafer 105 and the electrostatic chuck 130, one or more gases, such as He or Ar, is introduced between the wafer 105 and the electrostatic chuck 130 by the gas source 310. In some embodiments, the gas dissipates heat generated between the wafer 105 and the electrostatic chuck 130 during the application of the DC voltage.

As illustrated in FIG. 1, the semiconductor processing apparatus 100 also includes a pump 160 connected to the process chamber 110. The pump 160 is configured to provide a vacuum or maintain a certain gas pressure within the process chamber 110. In some embodiments, the pressure within the process chamber 110 is maintained by the combination of the gas or gases being introduced by the gas source 310 and a level of pumping performed by the pump 160. In some embodiments, the pressure within the process chamber 110 is maintained solely by pumping with the pump 160.

In some embodiments, the source of RF power 120 is turned on to apply a plasma 125 for plasma etching operations. The source of RF power 120 may be configured to generate an RF signal operating at a set frequency (e.g., 13.56 MHz), which transfers energy from the source of RF power 120 to the gas within the processing chamber 110. When sufficient power has been delivered to the gas, a plasma is ignited. In some embodiments, the power applied during the etching operations ranges from about 200 watts to about 700 watts. In some embodiments, application of an RF pulse occurs for a duration of about 10 seconds to about 60 seconds.

In some embodiments, a sealing ring 178 is substantially annular, and surrounds the electrostatic chuck 130. The sealing ring 178 may have thickness in the Z direction of at least about 20 mm. In some embodiments, the sealing ring 178 is a focus ring or edge ring. In some embodiments, the sealing ring 178 is separate from a focus ring or edge ring, for example, laterally surrounding the focus or edge ring or laterally surrounded by the focus ring or edge ring. In embodiments in which a separate focus or edge ring is present, the focus ring may be utilized for achieving a more uniform plasma distribution over the entire surface of the wafer 105 and for restricting the distribution of the plasma cloud to only the wafer surface area. In order to survive high temperature and hostile environments, the focus ring is frequently constructed of a ceramic material such as quartz. In some embodiments, the sealing ring 178 is constructed of ceramic material such as quartz, or other suitable material. In some embodiments, the sealing ring 178 includes a different material from the focus ring.

The semiconductor processing apparatus 100 also includes a spectral and/or charge monitoring system 180. The spectral and/or charge monitoring system 180 is configured to monitor surface charge level. In some embodiments, continuous or periodic monitoring by the spectral and/or charge monitoring system 180 provides a user with a history or profile of the semiconductor processing apparatus 100 throughout the etching apparatus's service life, or in some instances, any time period of the etching apparatus's service life. In some embodiments, the spectral and/or charge monitoring system 180 includes at least an optical emission spectrometer for performing optical emission spectroscopy (OES).

Operations of various components of the processing apparatus 100 may be controlled by a controller 60 connected to the components, for example, by one or more wired connections and/or wireless connections. The wired connections may be electrical, optical, or another suitable connection type. The wireless connections may be by electrical antennae, optical receivers, or other suitable wireless connection types. In some embodiments, the controller 60 is connected to one or more of the source of RF power 120, the source of DC power 140, the pump 160, the spectral and/or charge monitoring system 180, the gas source 310 and the flow verification unit 320 for controlling operations thereof. The controller is described in greater detail with reference to FIG. 6.

Figure 2A:
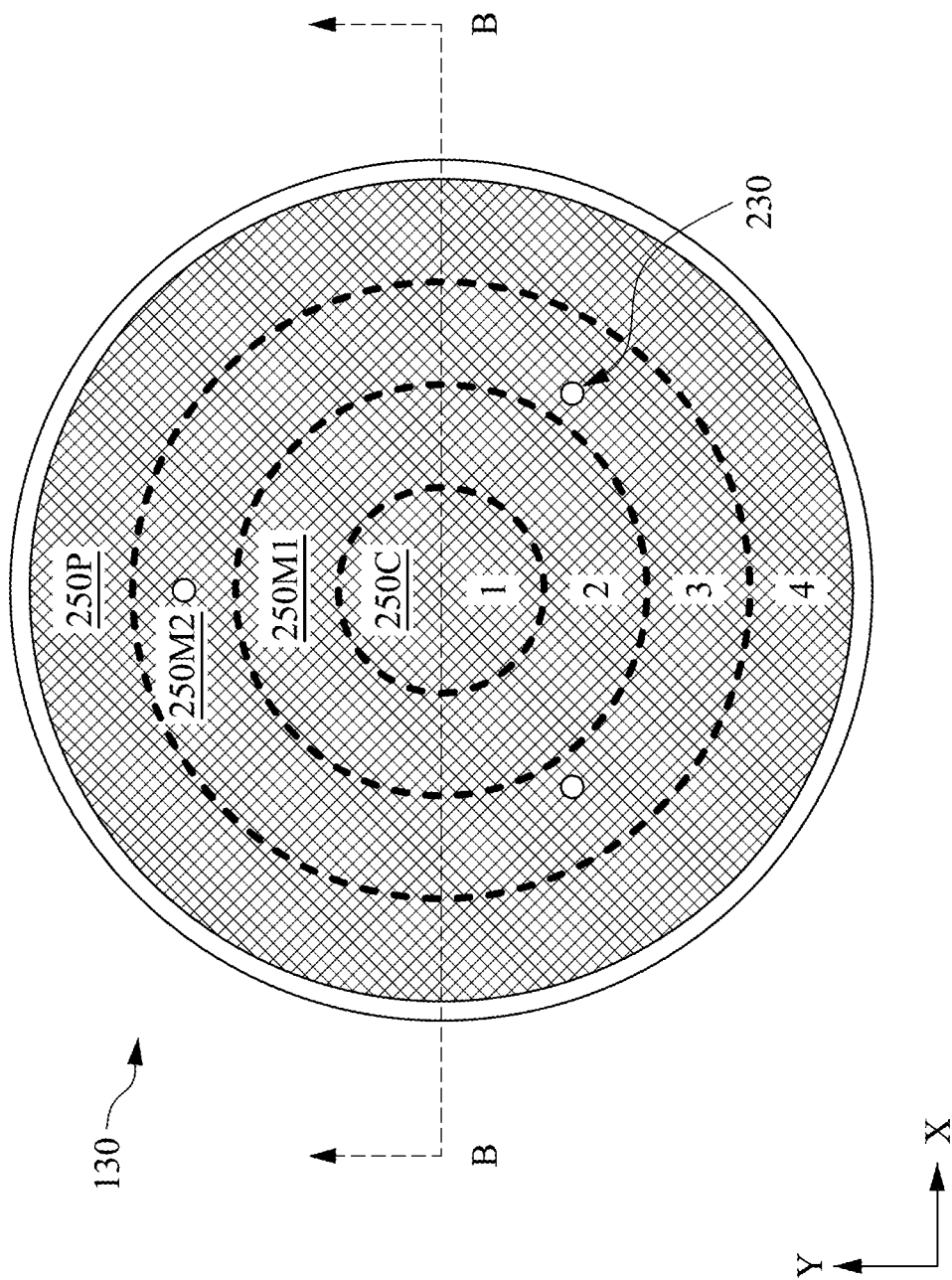
Figure 2B:
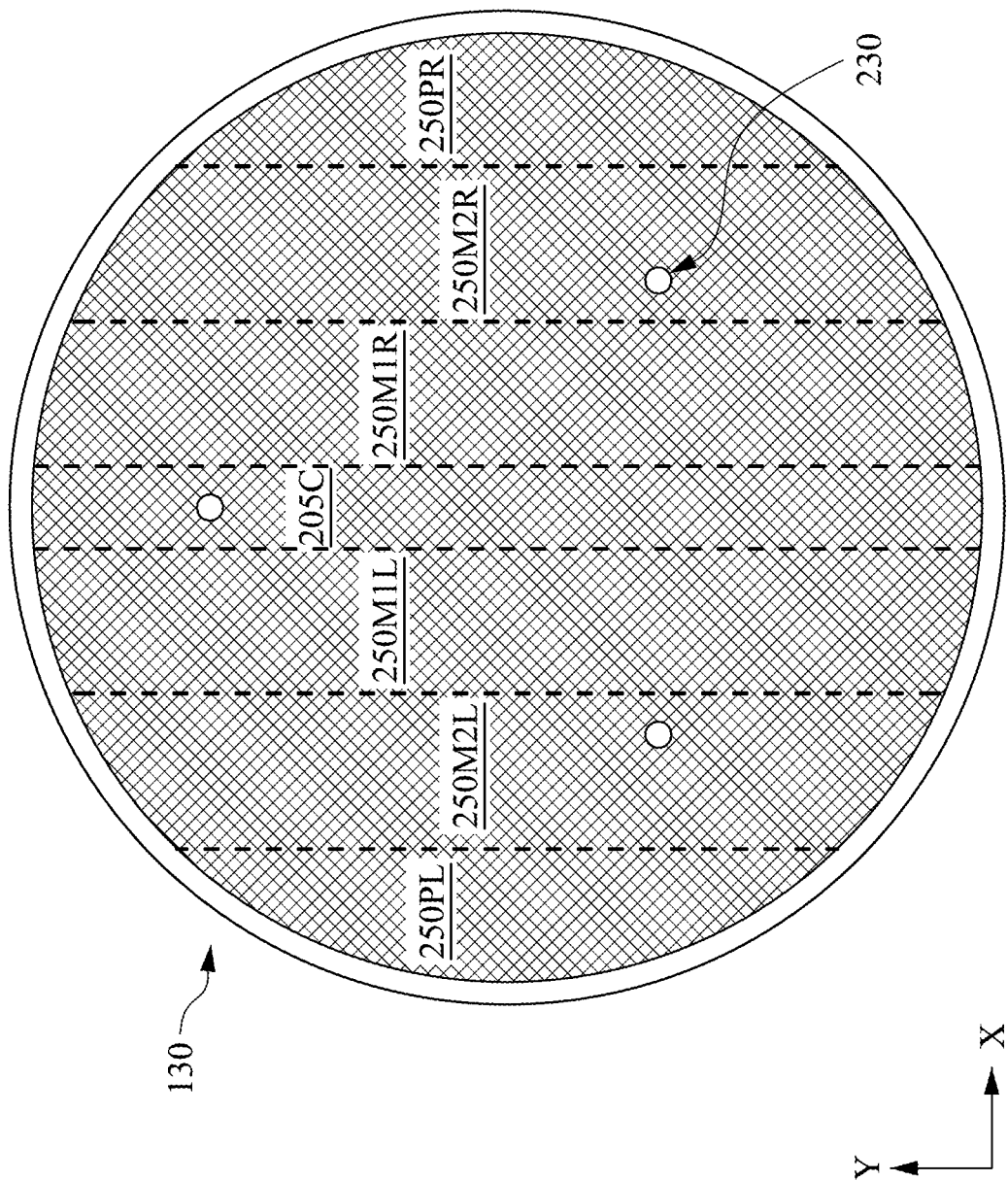
Figure 2C:
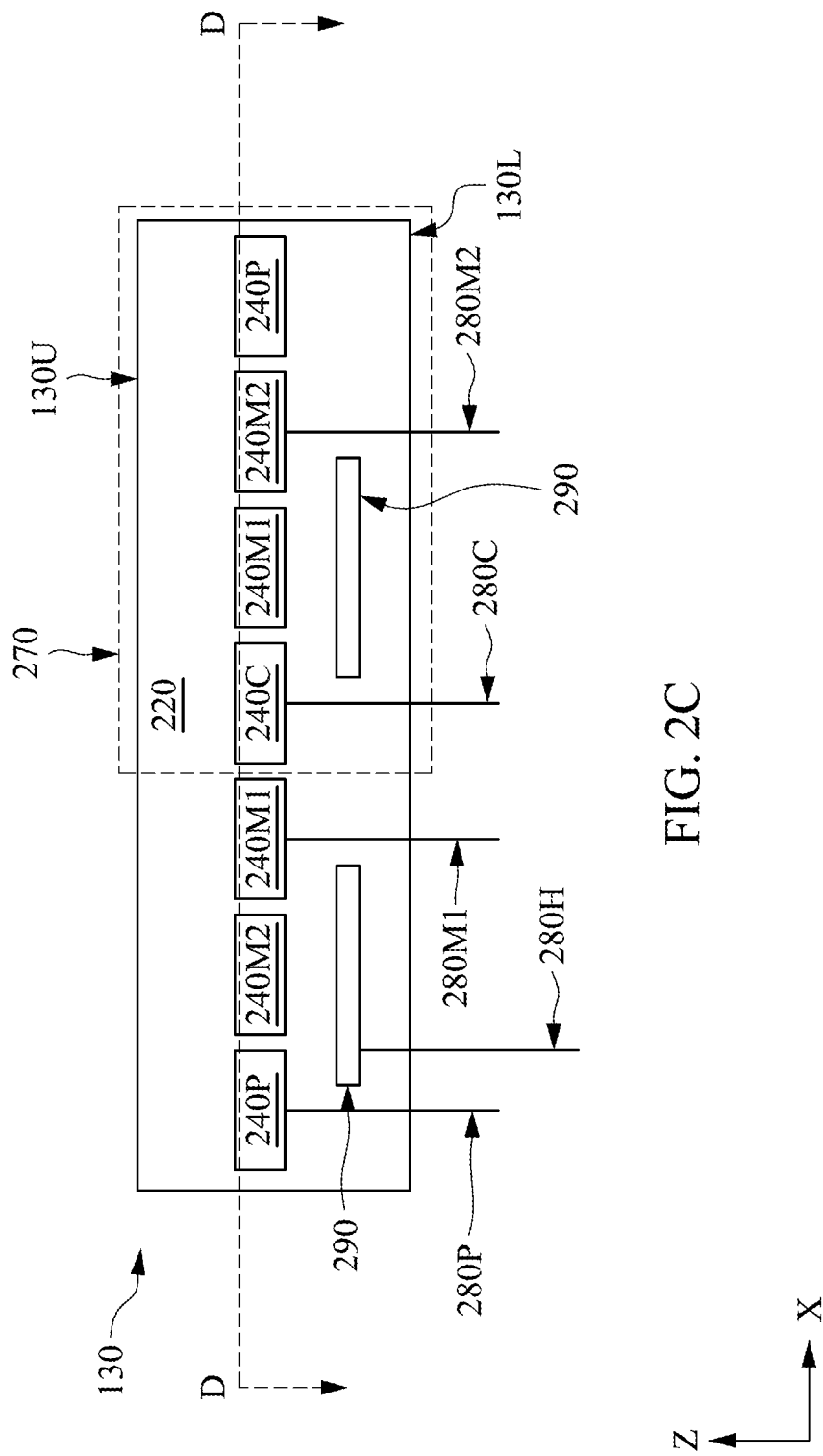

FIGS. 2A-2C are simplified views illustrating the electrostatic chuck 130 in accordance with various embodiments. FIGS. 2A and 2B are top views of the electrostatic chuck 130, and FIG. 2C is a cross-sectional view of the electrostatic chuck 130 along the sectional line B-B shown in FIG. 2A and FIG. 2B. The electrostatic chuck 130 as illustrated may be considered to have a unipolar electrode configuration. In some embodiments, the electrostatic chuck 130 has a bipolar electrode configuration.

Shifting of the wafer 105 during any semiconductor process, such as etching, deposition, implantation, or the like, can lead to overlay errors, which may cause circuit malfunctions or reductions in lifetime (e.g., reduced time-dependent dielectric breakdown, or "TDDB"). The electrostatic chuck 130 is configured to secure the wafer 105 (see FIG. 1) during the semiconductor processing, so as to prevent shifting of the wafer 105 throughout the semiconductor process. To reduce stress concentration and friction between the wafer 105 and the electrostatic chuck 130, the electrostatic chuck 130 is configured with two or more voltage application regions. As shown in FIGS. 2A, 2B, in some embodiments, the electrostatic chuck 130 includes four voltage application regions 250C, 250M1, 250M2 and 250P, which may also be referred to as "chuck regions." The electrostatic chuck 130 may include two, three, or more than four voltage application regions, in some embodiments.

The electrostatic chuck 130 includes a plurality of holes 230, which may be for providing access to pins used to raise or lower a wafer from/onto an upper surface 130U (see FIG. 2C) of the electrostatic chuck 130. The upper surface 130U (see FIG. 2C) of the electrostatic chuck 130 includes the four chuck regions, as shown in FIG. 2A, which include a center chuck region 250C, a peripheral chuck region 250P, and first and second middle chuck regions 250M1, 250M2, which may be referred to collectively as "the chuck regions 250." In some embodiments, the chuck regions 250 are of any suitable shape, such as circles, rings, stripes, wedges, or the like. As shown in FIG. 2A, the center chuck region 250C is a circle, and the remaining chuck regions 250 are rings arranged concentrically around the center chuck region 250C. An embodiment in which the chuck regions 250 are stripes is shown in FIG. 2B. As shown, the stripe-shaped chuck regions 250 are generally symmetrical relative to the center chuck region 250C, and are labeled with the suffix "-R" or the suffix "-L" to distinguish between left-side and right-side regions. The chuck regions 250, in FIG. 2A and FIG. 2B, generally correspond to locations of securing electrodes 240 (see FIGS. 2C-2G) embedded in a substrate 220 and underlying the upper surface 130U. The wafer 105 experiences the Coulomb force from the securing electrodes 240 independently in the chuck regions 250, as is described in greater detail below. The chuck regions 250 may have shapes of concentric circles/rings or stripes, as shown, or may have other suitable shapes, such as quarter-circles, a combination of the described shapes, or the like.

In FIG. 2C, the electrostatic chuck 130 includes the substrate 220. In some embodiments, the substrate 220 is a circular plate that is or includes a ceramic or other suitable material. The substrate 220 includes the upper surface 130U, which may face the wafer 150, in some embodiments. A lower surface 130L of the substrate 220 is opposite the upper surface 130U, and may face the insulating ceramic frame 116.

Securing electrodes 240C, 240M1, 240M2, 240P (also collectively referred to as "the securing electrodes 240") are embedded in the substrate 220, and may have shape similar to the chuck regions 250, such as circles, rings, stripes, wedges, or other suitable shape. Heating electrodes 290 may also be embedded in the substrate 220, as shown in FIG. 2C. Generally, the securing electrodes 240 provide electrostatic force to attract the wafer 105 and secure the wafer 105 to the electrostatic chuck 130, and the heating electrodes 290 regulate temperature of the substrate 220. In some embodiments, the heating electrodes 290 are near the lower surface 130L, and the securing electrodes 240 are near the upper surface 130U.

The securing electrodes 240 and the heating electrodes 290 may be configured to receive a direct current (DC) or alternating current (AC) voltage. In some embodiments, conductors 280, including conductors 280C, 280M1, 280M2, 280P, 280H, are electrically connected to the securing electrodes 240C, 240M1, 240M2, 240P, and the heating electrode 290, respectively. Each of the conductors 280 may be electrically connected to, for example, the source of DC power 140. In some embodiments, the source of DC power 140 is configured to drive each securing electrode 240 or heating electrode 290 independently, such that as few as one of the securing electrodes 240 or heating electrodes 290 may be driven at one time, while remaining securing electrodes 240 or heating electrodes 290 are not driven (e.g., grounded, floating, or reverse biased relative to the driven securing or heating electrode 240, 290).

Figure 2D:
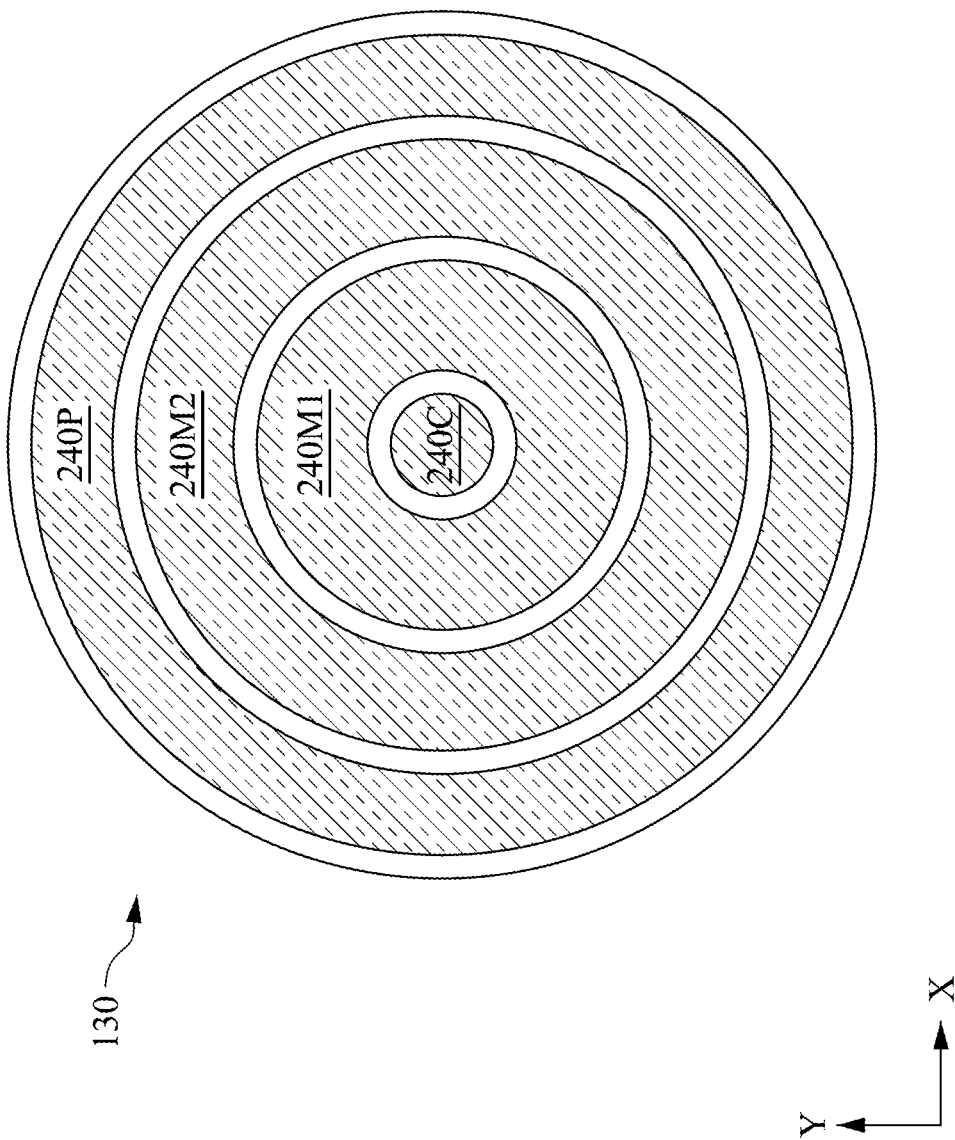

FIG. 2D and FIG. 2E are cross-sections illustrating the securing electrodes 240 in accordance with various embodiments. In FIG. 2D, the center securing electrode 240C is substantially circular, and the remaining securing electrodes 240M1, 240M2, 240P are arranged as concentric rings around the center securing electrode 240C. In some embodiments, the conductors 280 (not separately illustrated for clarity) vertically underlie and contact the securing electrodes 240. In some embodiments, the conductors 280 extend in the same plane (e.g., the X-Y plane) as the securing electrodes 240, and extend laterally outward toward the outer sidewall of the electrostatic chuck 130. Such a configuration is illustrated in FIG. 2E, which may be desirable for establishing an electrical connection port at the outer sidewall of the electrostatic chuck 130. In some embodiments, the configurations shown in FIG. 2D and FIG. 2E may be combined, such that the conductors 280 extend laterally from the securing electrodes 240, and extend vertically toward the lower surface 130L near the outer sidewall of the electrostatic chuck 130.

Figure 2F:
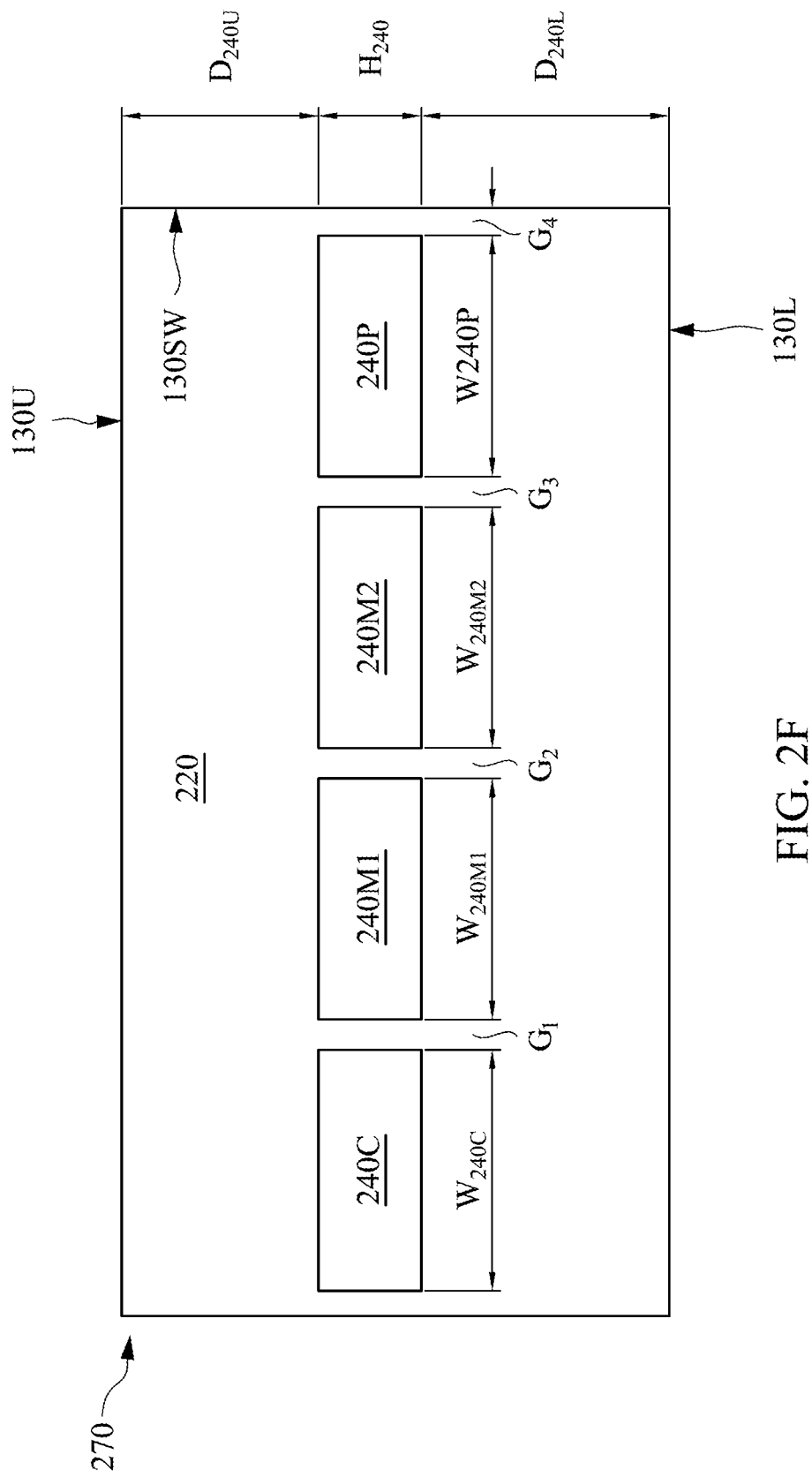

FIG. 2F is an enlarged cross-sectional side view of a region 270 highlighted by a dashed rectangle in FIG. 2C. FIG. 2F illustrates various dimensions and relative positions of the securing electrodes 240 in the substrate 220. To simplify illustration, the heating electrodes 290 are not shown in FIG. 2F.

As shown in FIG. 2F, the central securing electrode 240C has a width $W_{240C}$ and a height $H_{240}$. In some embodiments, the width $W_{240C}$ and height $H_{240}$ are substantially uniform throughout the central securing electrode 240C, though varying width and/or height of the central securing electrode 240C may be desirable in some configurations. Cross-sectional shape of the central securing electrode 240C is generally rectangular. In some embodiments, the cross-sectional shape may rectangular, square, circular, ovular, or the like, and may include rounded or chamfered corners.

The middle securing electrode 240M1 has a width $W_{240M1}$ and a height $H_{240}$. In some embodiments, the width $W_{240M1}$ and height $H_{240}$ are substantially uniform throughout the middle securing electrode 240M1, though varying width and/or height of the middle securing electrode 240M1 may be desirable in some configurations. Cross-sectional shape of the middle securing electrode 240M1 is generally rectangular. In some embodiments, the cross-sectional shape may rectangular, square, circular, ovular, or the like, and may include rounded or chamfered corners.

The middle securing electrode 240M2 has a width $W_{240M2}$ and a height $H_{240}$. In some embodiments, the width $W_{240M2}$ and height $H_{240}$ are substantially uniform throughout the middle securing electrode 240M2, though varying width and/or height of the middle securing electrode 240M2 may be desirable in some configurations. Cross-sectional shape of the middle securing electrode 240M2 is generally rectangular. In some embodiments, the cross-sectional shape may rectangular, square, circular, ovular, or the like, and may include rounded or chamfered corners.

The peripheral securing electrode 240P has a width $W_{240P}$ and a height $H_{240}$. In some embodiments, the width $W_{240P}$ and height $H_{240}$ are substantially uniform throughout the peripheral securing electrode 240P, though varying width and/or height of the peripheral securing electrode 240P may be desirable in some configurations. Cross-sectional shape of the peripheral securing electrode 240P is generally rectangular. In some embodiments, the cross-sectional shape may rectangular, square, circular, ovular, or the like, and may include rounded or chamfered corners.

In some embodiments, the width $W_{240C}$ is substantially the same as the widths $W_{240M1}$, $W_{240M2}$, $W_{240P}$. In some embodiments, one or more of the widths $W_{240C}$, $W_{240M1}$, $W_{240M2}$, $W_{240P}$ are different from others of the widths $W_{240C}$, $W_{240M1}$, $W_{240M2}$, $W_{240P}$. In some embodiments, the height $H_{240}$ is substantially the same for each of the securing electrodes 240. In some embodiments, one or more of the securing electrodes 240 (e.g., the central securing electrode 240C) has a different height than others of the securing electrodes 240 (e.g., the middle and peripheral securing electrodes 240M1, 240M2, 240P).

In some embodiments, neighboring pairs of the securing electrodes 240 are separated laterally by gaps, and the peripheral securing electrode 240P is separated from an outer sidewall 130SW of the electrostatic chuck 130 by a gap. As shown in FIG. 2F, the center securing electrode 240C is separated from the middle securing electrode 240M1 by a first gap $G_1$. The middle securing electrodes 240M1, 240M2 are separated by a second gap $G_2$. The middle securing electrode 240M2 is separated from the peripheral securing electrode 240P by a third gap $G_3$. The peripheral securing electrode 240P is separated from the outer sidewall 130SW of the electrostatic chuck by a fourth gap $G_4$. The first, second, third and fourth gaps $G_1$-$G_4$ may be referred to collectively as "gaps $G_1$-$G_4$." In some embodiments, the gaps $G_1$-$G_4$ have substantially the same magnitude. For example, the first gap $G_1$ may be substantially the same size as the second, third and fourth gaps $G_2$-$G_4$. In some embodiments, certain of the gaps $G_1$-$G_4$ have a different size from certain other of the gaps $G_1$-$G_4$. For example, the fourth gap $G_4$, which may also be referred to as a "peripheral gap," between the peripheral securing electrode 240P and the outer sidewall 130SW may be larger than the gaps $G_1$-$G_3$, which may be referred to as "inter-electrode gaps," between each pair of the securing electrodes 240. In some embodiments, the first gap $G_1$ is larger than the second gap $G_2$, which is in turn larger than the third gap $G_3$. In some embodiments, the first gap $G_1$ is smaller than the second gap $G_2$, which is in turn smaller than the third gap $G_3$. In some embodiments, the gaps $G_1$-$G_4$ are of any suitable sizes, and may not follow any particular gradient.

In some embodiments, the securing electrodes 240 are separated from the upper surface 130U of the substrate 220 by an upper distance $D_{240U}$, and are separated from the lower surface 130L by a lower distance $D_{240L}$. In some embodiments, the substrate 220 has a thickness in a range of about 1 mm to about 5 mm. In some embodiments, the upper distance $D_{240U}$ and the lower distance $D_{240L}$ are substantially the same, such as having a ratio of the upper distance $D_{240U}$ to the lower distance $D_{240L}$ in a range of about 0.85 to about 1.15. In some embodiments, one or more of the securing electrodes 240 is separated from the upper surface 130U or the lower surface 130L by a different upper or lower distance $D_{240U}$, $D_{240L}$ than others of the securing electrodes 240.

Figure 2G:
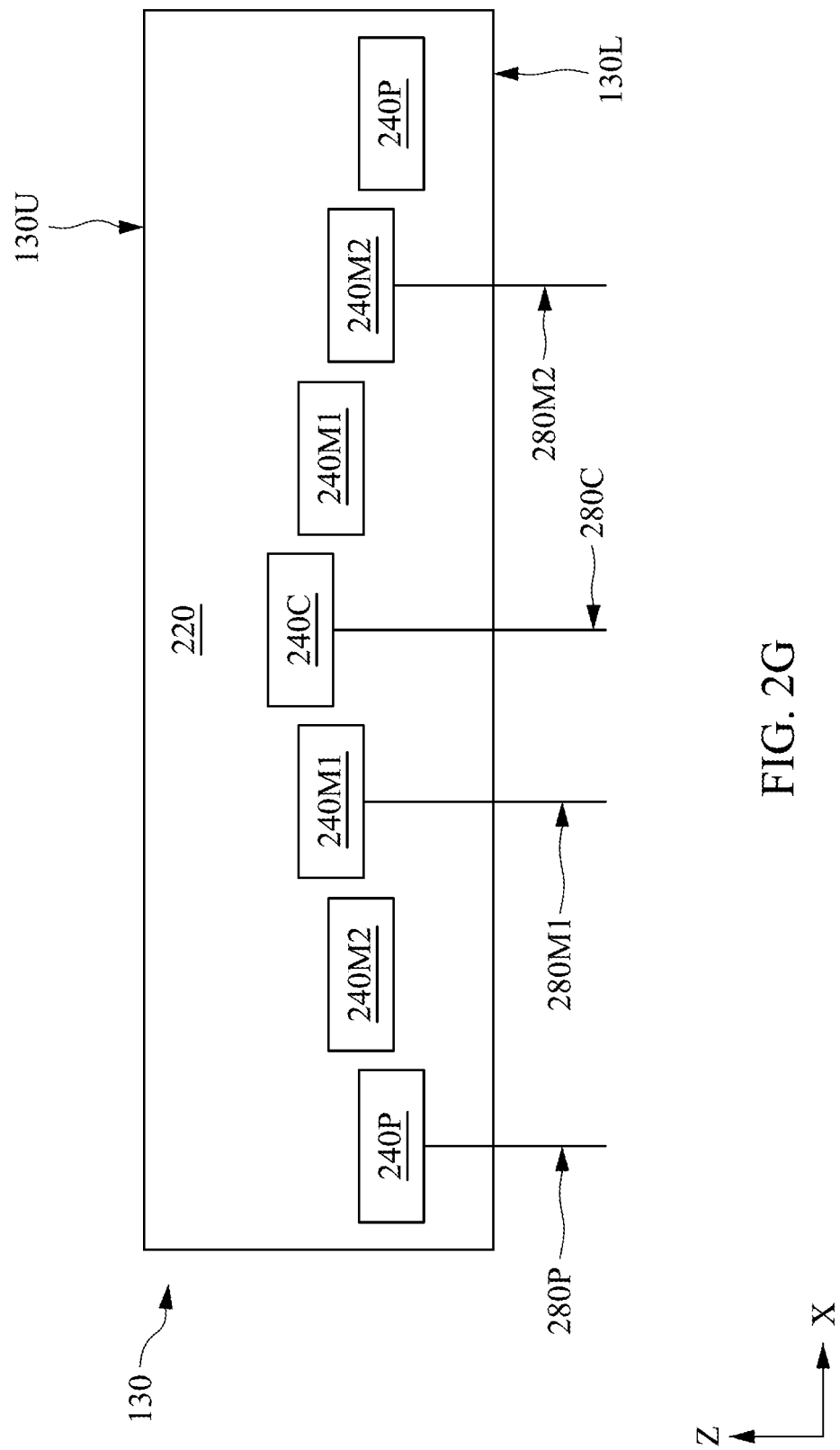

FIG. 2G illustrates a configuration in which the central securing electrode 240C is closer to the upper surface 130U than the middle securing electrode 240M1, which is closer to the upper surface 130U than the middle securing electrode 240M2, which is closer to the upper surface 130U than the peripheral securing electrode 240P. In some embodiments, the central securing electrode 240C is further from the lower surface 130L than the middle securing electrode 240M1, which is further from the lower surface 130L than the middle securing electrode 240M2, which is further from the lower surface 130L than the peripheral securing electrode 240P.

Figure 2H:
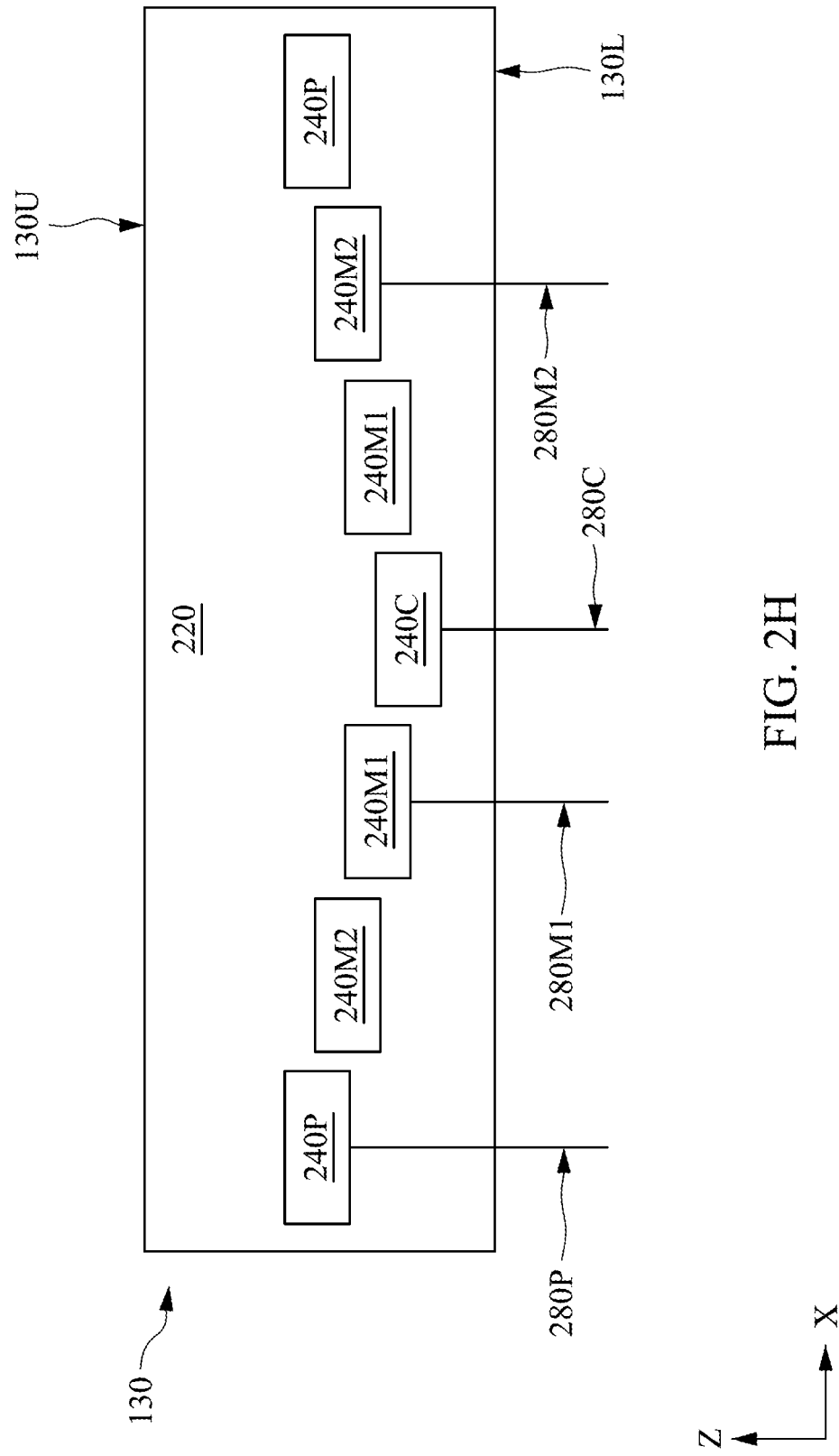

FIG. 2H illustrates a configuration in which the central securing electrode 240C is further from the upper surface 130U than the middle securing electrode 240M1, which is further from the upper surface 130U than the middle securing electrode 240M2, which is further from the upper surface 130U than the peripheral securing electrode 240P. In some embodiments, the central securing electrode 240C is closer to the lower surface 130L than the middle securing electrode 240M1, which is closer to the lower surface 130L than the middle securing electrode 240M2, which is closer to the lower surface 130L than the peripheral securing electrode 240P.

Figure 2I:
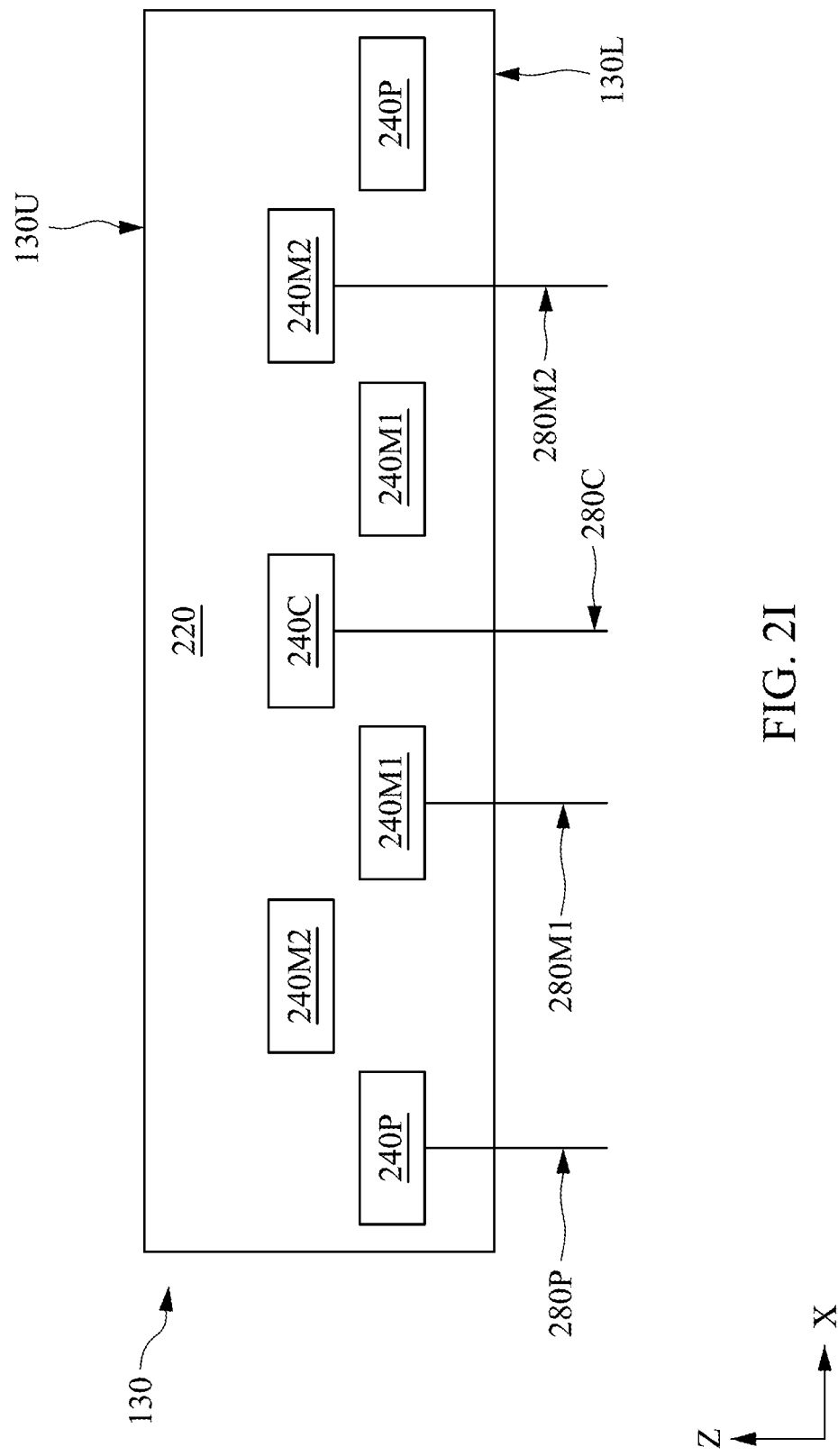

FIG. 2I illustrates a configuration in which vertical positions of the securing electrodes 240 are not uniform nor subject to a gradient. In the example shown in FIG. 2I, the central securing electrode 240C is nearest the upper surface 130U and furthest the lower surface 130L. The middle securing electrode 240M1 and the peripheral securing electrode 240P are nearest the lower surface 130L and furthest the upper surface 130U. The middle securing electrode 240M2 is vertically between the central securing electrode 240C and the middle and peripheral securing electrodes 240M1, 240P.

In addition to the above, other or additional properties of the materials selected to fabricate the electrostatic chuck 130 may be beneficial. For example, in some embodiments, the overall coefficient of thermal expansion of the electrostatic chuck 130 may be substantially similar to the coefficient of thermal expansion of a substrate (e.g., the wafer 105 described in FIG. 1) disposed thereon. By providing substantially similar coefficient of thermal expansions both the substrate and the electrostatic chuck 130 expand at a substantially similar rate when heated, thereby reducing friction between the substrate, thus reducing damage to the substrate when heated.

FIGS. 3A-3E are timing diagrams illustrating timing of application of voltages $V_C$, $V_{M1}$, $V_{M2}$, $V_P$ to the securing electrodes 240C, 240M1, 240M2, 240P, respectively. By clamping the wafer 105 through a multi-stage process, the wafer 105 may be fully extended on the electrostatic chuck 130 (e.g., from center to edge), which may resemble a suction process. By this progressive clamping process, stress concentration of the wafer 105 and contamination may be reduced. Waveforms 310C, 310M1, 310M2, 310P correspond to the voltages $V_C$, $V_{M1}$, $V_{M2}$, $V_P$, respectively. In FIGS. 3A-3E, the voltages $V_C$, $V_{M1}$, $V_{M2}$, $V_P$ are applied, maintained (or "held"), increase/decreased, and/or released (or "removed") in various phases. Application may refer to the initial increase of a voltage from, for example, a ground voltage level (e.g., 0 Volts) to an operating voltage level, such as about 1 kV to about 9 kV. Maintaining or holding may refer to keeping the voltage at the operating voltage level without substantial return to the ground voltage level. Increasing/decreasing may refer to raising the voltage level or lowering the voltage level from an initial operating voltage level to another operating voltage level above the ground voltage level but different from the initial operating voltage level. Releasing or removing the voltage may refer to reducing the voltage from the operating voltage level to, for example, the ground voltage level or a floating voltage level. In some embodiments, one or more voltage sources is directly connected to the securing electrode(s), and supplies the voltages $V_C$, $V_{M1}$, $V_{M2}$, $V_P$ that are varied from a high/operating voltage level (applied) to a low/non-operating (removed, e.g., grounded). In some embodiments, the one or more voltage sources are connected to each of the securing electrode(s) through a switch(es), such that the switch connects (applies) or disconnects (removes, e.g., floats) the voltages $V_C$, $V_{M1}$, $V_{M2}$, $V_P$ to/from the securing electrode(s).

Figure 3A:
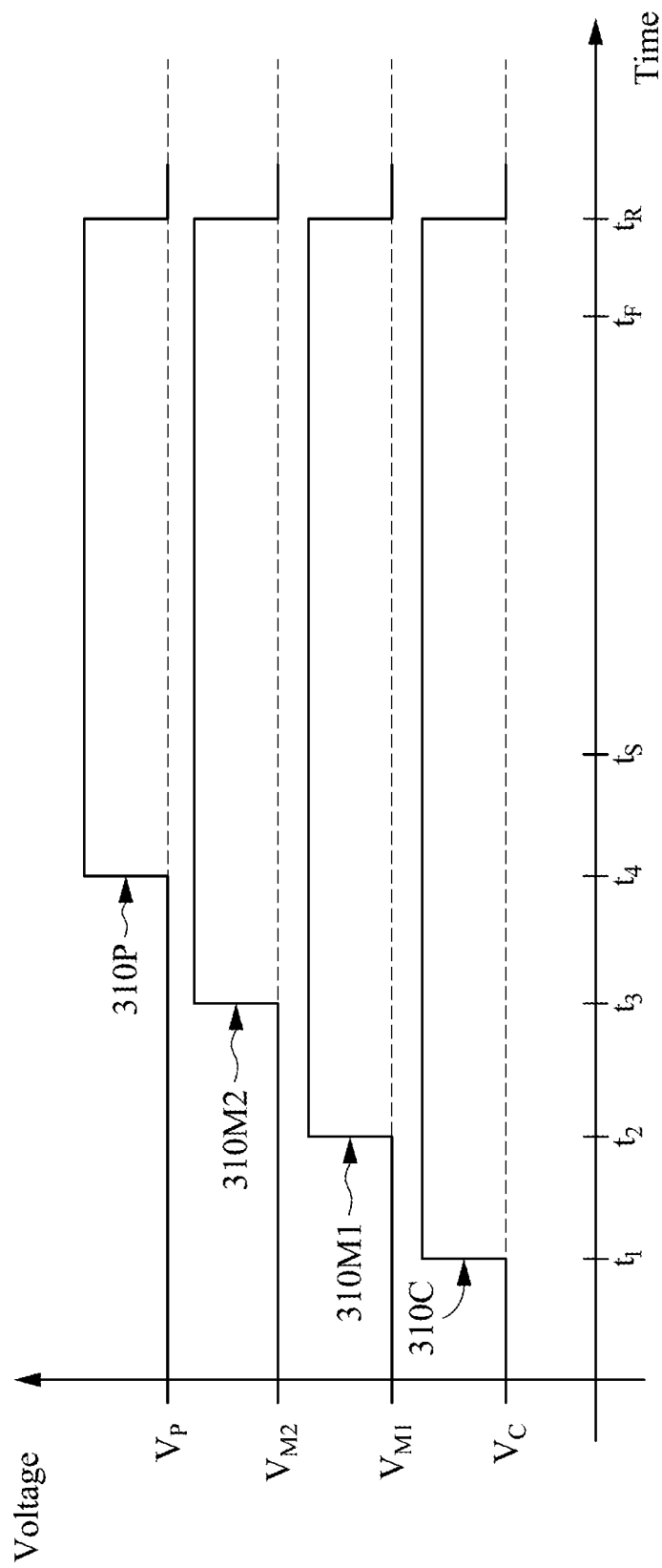
FIGS. 3A-3E are views illustrating waveforms for operating the electrostatic chuck according to various aspects of the present disclosure.

In FIG. 3A, application of the voltages $V_C$, $V_{M1}$, $V_{M2}$, $V_P$ is in a sequence from the center of the electrostatic chuck 130 toward the periphery of the electrostatic chuck 130. The sequence in FIG. 3A may be beneficial for reducing stress when the wafer 105 has warpage. For example, the central region of the wafer 105 may be separated from the electrostatic chuck 130 by a larger distance than the peripheral region of the wafer 105, corresponding to convex warpage. As such, by securing the central region of the wafer 105 first, the peripheral region of the wafer 105 may flatten gradually due to the curvature of the wafer 105 without the presence of a strong electrostatic force pulling the peripheral region of the wafer 105 into the electrostatic chuck 130, which would cause friction and potential damage to the peripheral region.

In FIG. 3A, a central voltage $V_C$ is applied to the central securing electrode 240C at a first time $t_1$. Prior to the first time $t_1$, the central securing electrode 240C may be grounded (e.g., at 0 Volts). In some embodiments, the central voltage $V_C$ is in a range of about 1 kilovolt (kV) to about 9 kV, and/or in a range of about 3 kV to about 5 kV. In some embodiments, voltage slew rate of the central voltage $V_C$ is in a range of about 10 kV/s to about 20 kV/s, such as about 15 kV/s. As such, time from application of the central voltage $V_C$ to the central securing electrode 240C being fully charged may be in a range of about 0.05 seconds to about 0.9 seconds.

At a second time $t_2$, a first middle voltage $V_{M1}$ is applied to the middle securing electrode 240M1. In some embodiments, the second time $t_2$ is after the central securing electrode 240C is fully charged. In some embodiments, the second time $t_2$ is a moment at which the central securing electrode 240C is partially charged. For example, if the central voltage $V_C$ is 5 kV, and the voltage slew rate is 10 kV/s, 0.5 seconds pass between the first time $t_1$ and when the central securing electrode 240C is fully charged to 5 kV. As such, in some embodiments, the second time $t_2$ may follow the first time $t_1$ by at least 0.5 seconds, and in other embodiments, the second time $t_2$ may follow the first time $t_1$ by less than 0.5 seconds, such as about 0.25 seconds, corresponding to a half-charged state (e.g., 2.5 kV) of the central securing electrode 240C. By staggering the application of the central voltage $V_C$ and the first middle voltage $V_{M1}$, stress concentration is reduced.

At a third time $t_3$, a second middle voltage $V_{M2}$ is applied to the middle securing electrode 240M2. In some embodiments, the third time $t_3$ is after the middle securing electrode 240M1 is fully charged. In some embodiments, the third time $t_3$ is a moment at which the middle securing electrode 240M1 is partially charged. By staggering the application of the first middle voltage $V_{M1}$ and the second middle voltage $V_{M2}$, stress concentration is reduced.

At a fourth time $t_4$, a peripheral voltage $V_P$ is applied to the peripheral securing electrode 240P. In some embodiments, the fourth time $t_4$ is after the middle securing electrode 240M2 is fully charged. In some embodiments, the fourth time $t_4$ is a moment at which the middle securing electrode 240M2 is partially charged. By staggering the application of the second middle voltage $V_{M2}$ and the peripheral voltage $V_P$, stress concentration is reduced.

From a start time $t_S$ to a finish time $t_F$, the wafer 105 is fully clamped by the securing electrodes 240, as indicated by all voltages $V_C$, $V_{M1}$, $V_{M2}$, $V_P$ being applied and all securing electrodes 240 being fully charged. In the period from the start time $t_S$ to the finish time $t_F$, the wafer 105 may be processed by the semiconductor processing apparatus 100. The start time $t_S$ may correspond to a time at which processing (e.g., etching, depositing, cleaning, annealing, or the like) begins. The finish time $t_F$ may correspond to a time at which the processing ends. After the finish time $t_F$, the wafer 105 is released at a release time $t_R$. In some embodiments, as shown in FIG. 3A, all of the securing electrodes 240 are discharged simultaneously at the release time $t_R$. Following substantially complete discharge of the securing electrodes 240, the wafer 105 may be lifted by the pins from the upper surface 130U of the electrostatic chuck 130, and removed from the semiconductor processing apparatus 100, for example, by a robotic transfer arm.

As illustrated in FIG. 3A, the application of the voltages $V_C$, $V_{M1}$, $V_{M2}$, $V_P$ is in the sequence from the center of the electrostatic chuck 130 toward the periphery of the electrostatic chuck 130. The sequence may be beneficial when securing the wafer 105 having convex warpage. In some embodiments, the application of the voltages $V_C$, $V_{M1}$, $V_{M2}$, $V_P$ is in a different sequence, such as from the periphery of the electrostatic chuck 130 toward the center of the electrostatic chuck 130. The different sequence described may be beneficial when securing the wafer 105 having concave warpage. Other sequences than from center to periphery or from periphery to center may also provide benefits, such as for the wafer 105 having complex warpage, e.g., a combination of convex and concave warpage.

In some embodiments, sequence of the application of the voltages $V_C$, $V_{M1}$, $V_{M2}$, $V_P$ is determined based on one or more characteristics of the wafer 105, such as warpage, circuit layout, processing conditions, or the like. In some embodiments, the sequence is determined based on one or more characteristics of the electrostatic chuck 130, such as surface uniformity, location of the securing electrodes 240, operating condition of the securing electrodes 240, or the like. In some embodiments, sequence of application of the voltages $V_C$, $V_{M1}$, $V_{M2}$, $V_P$ is determined automatically during the application of the voltages $V_C$, $V_{M1}$, $V_{M2}$, $V_P$. For example, flatness or other characteristics of the various regions (central, middle, peripheral) of the wafer 105 on the electrostatic chuck 130 may be monitored in real time, and the sequence of the voltages $V_C$, $V_{M1}$, $V_{M2}$, $V_P$ may be adjusted on-the-fly. In some embodiments, a voltage that has already been applied may be lowered or disabled based on the monitoring, then reapplied following application of others of the voltages $V_C$, $V_{M1}$, $V_{M2}$, $V_P$.

Figure 3B:
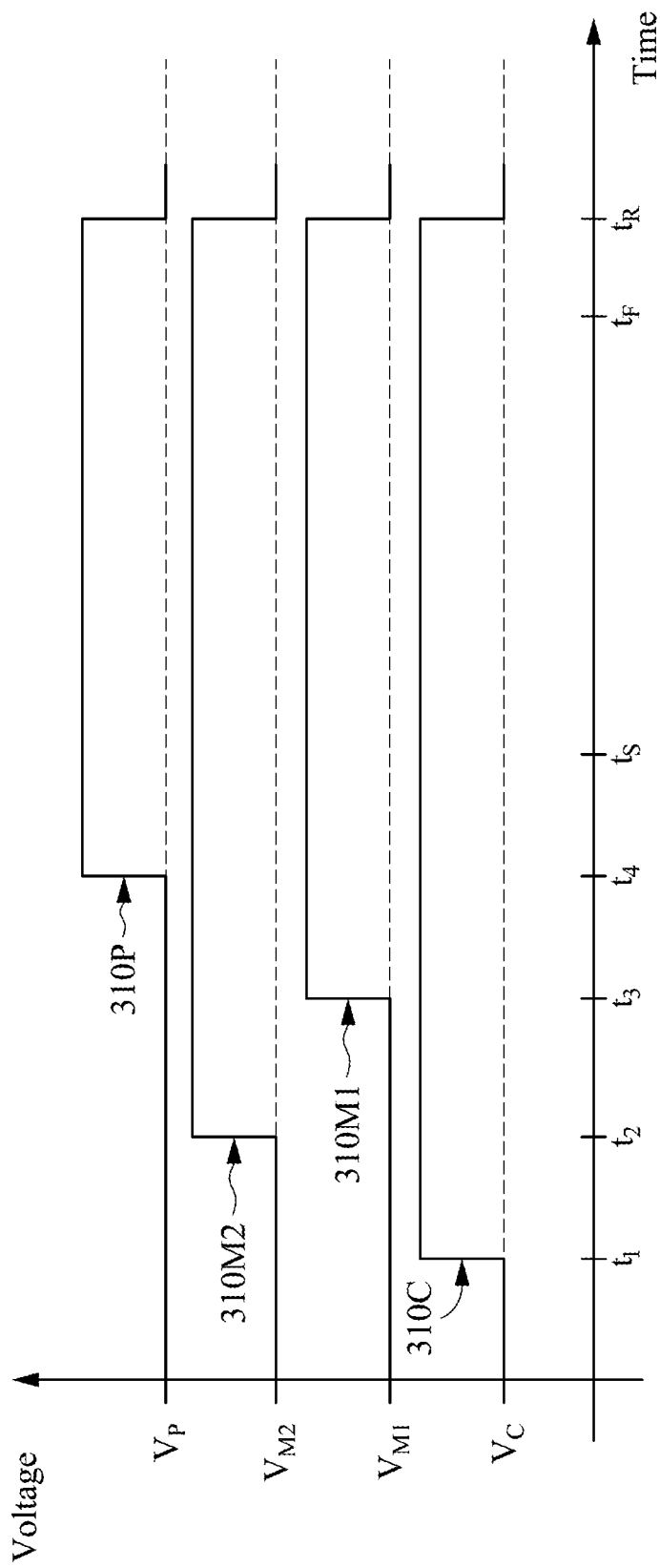

FIG. 3B is similar to FIG. 3A in many respects, and details about voltage magnitudes and slew rates are similar to those described with reference to FIG. 3A. In some embodiments, order of application of the voltages $V_C$, $V_{M1}$, $V_{M2}$, $V_P$ is not from the center of the chuck electrode 130 to the periphery of the chuck electrode 130. For example, in FIG. 3B, the central voltage $V_C$ is applied at the time $t_1$, the second middle voltage $V_{M2}$ is applied at the time $t_2$, the first middle voltage $V_{M1}$ is applied at the time $t_3$, and the peripheral voltage $V_P$ is applied at the time $t_4$. As such, the middle securing electrode 240M2 begins charging, and/or is fully charged, prior to beginning charging the middle securing electrode 240M1, which is between the middle securing electrode 240M2 and the central securing electrode 240C. The embodiment shown in FIG. 3B is one example of non-directional, or "arbitrary," application of the voltages $V_C$, $V_{M1}$, $V_{M2}$, $V_P$. In some embodiments, order of application of the voltages may be a first sequence (e.g., $V_{M1} \rightarrow V_P \rightarrow V_C \rightarrow V_{M2}$). In some embodiments, during a first wafer fabrication process, order of the application of the voltages $V_C$, $V_{M1}$, $V_{M2}$, $V_P$ may be the first sequence, and during a subsequent second wafer fabrication process (e.g., same tool, different wafer; or, same wafer, different tool), order of the application of the voltages $V_C$, $V_{M1}$, $V_{M2}$, $V_P$ may be a second sequence different from the first sequence (e.g., $V_P \rightarrow V_{M2} \rightarrow V_C \rightarrow V_{M1}$).

Figure 3C:
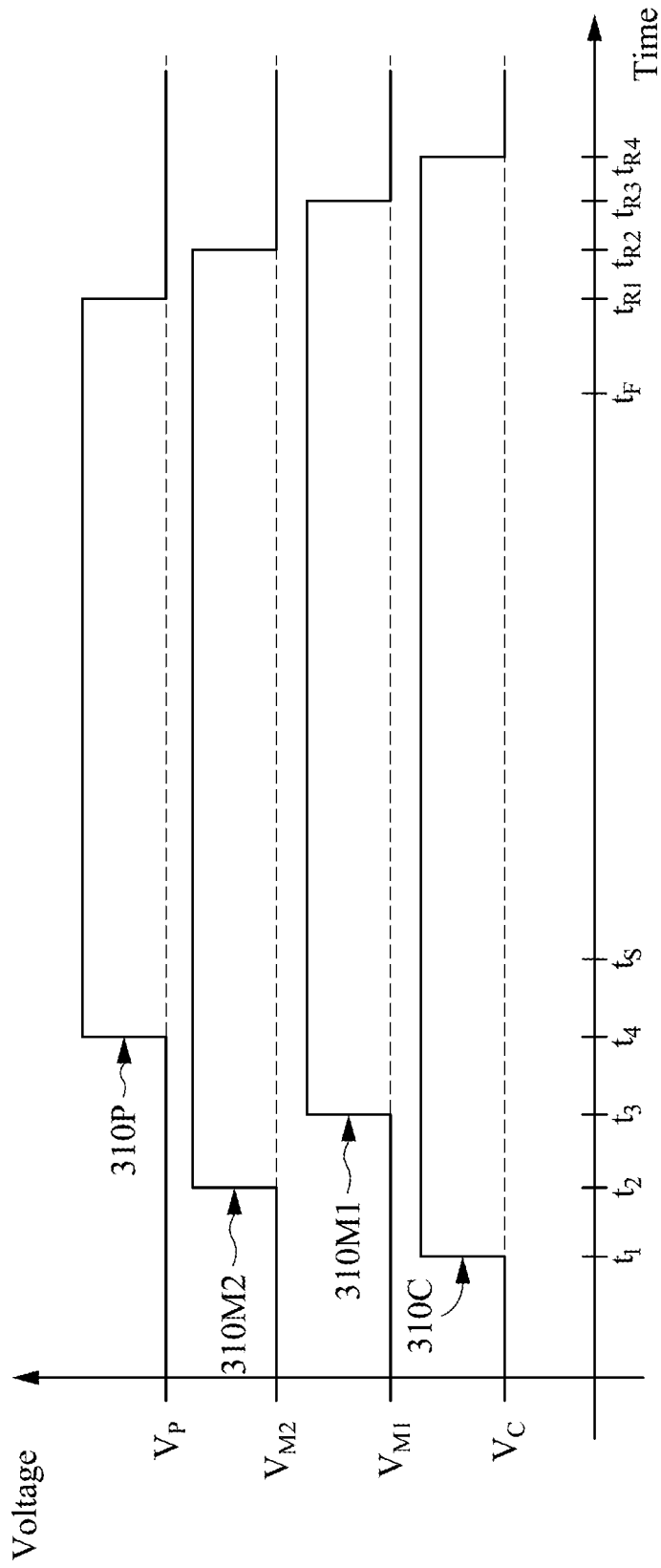

FIG. 3C is similar to FIGS. 3A and 3B in many respects, and details about voltage magnitudes and slew rates are similar to those described with reference to FIGS. 3A and 3B. In some embodiments, the voltages $V_C$, $V_{M1}$, $V_{M2}$, $V_P$ are released at different times $t_{R1}$, $t_{R2}$, $t_{R3}$, $t_{R4}$ (e.g., in a staggered manner) following completion of the process at the time $t_F$. As shown in FIG. 3C, the peripheral voltage $V_P$ is discharged first at the time $t_{R1}$ to release a peripheral wafer region of the wafer 105 overlying the peripheral securing region 250P and corresponding to the peripheral securing electrode 240P. The second middle voltage $V_{M2}$ is discharged second at the time $t_{R2}$ to release a middle wafer region of the wafer 105 overlying the middle chuck region 250M2 and corresponding to the middle securing electrode 240M2. The first middle voltage $V_{M1}$ is discharged third at the time $t_{R3}$ to release a middle wafer region of the wafer 105 overlying the middle chuck region 250M1 and corresponding to the middle securing electrode 240M1. The central voltage $V_C$ is discharged fourth at the time $t_{R4}$ to release a central wafer region of the wafer 105 overlying the central chuck region 250C and corresponding to the central securing electrode 240C.

Figure 3D:
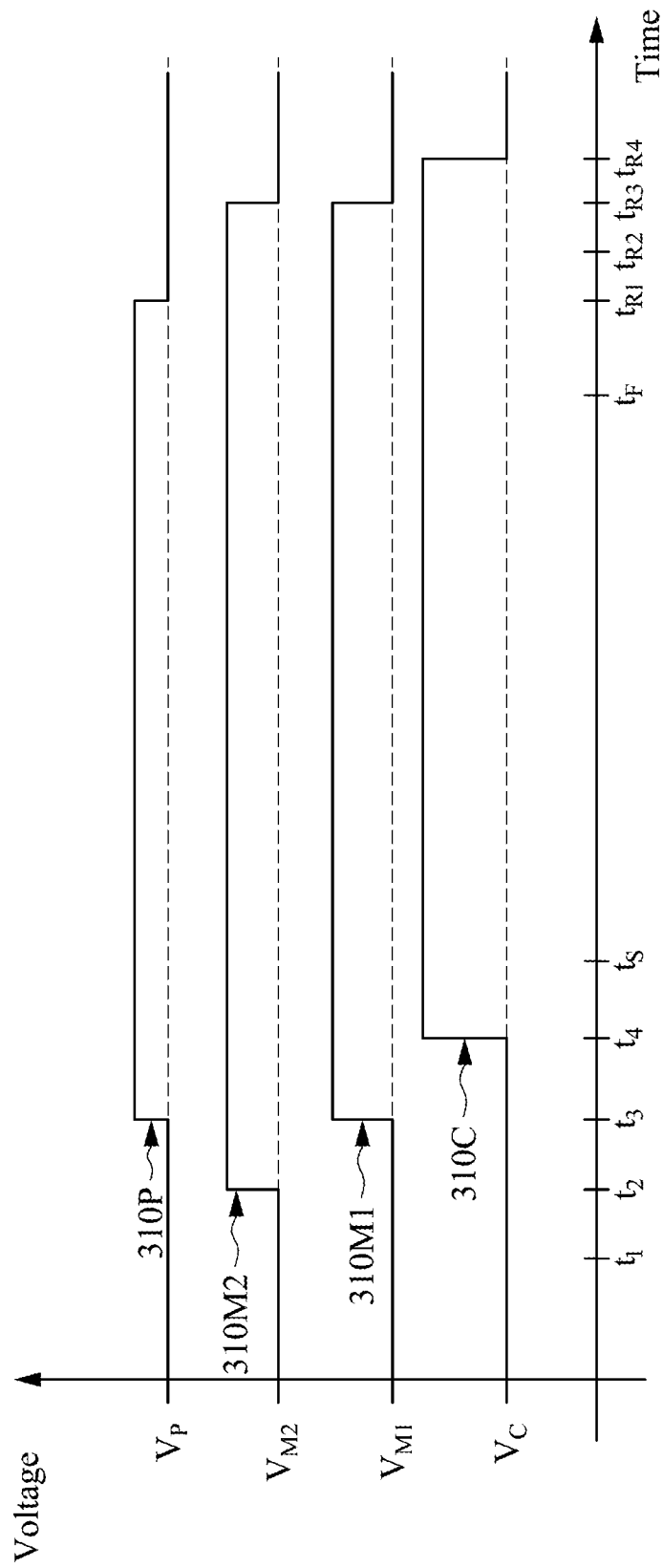

FIG. 3D is similar to FIGS. 3A, 3B and 3C in many respects, and details about voltage magnitudes and slew rates may be similar to those described with reference to FIGS. 3A, 3B and 3C. In some embodiments, two or more of the voltages $V_C$, $V_{M1}$, $V_{M2}$, $V_P$ are applied or released at substantially the same time. For example, as shown in FIG. 3D, the second middle voltage $V_{M2}$ is applied first at the time $t_2$. Following application of the second middle voltage $V_{M2}$, the first middle voltage $V_{M1}$ and the peripheral voltage $V_P$ are applied substantially simultaneously at the time $t_3$. The central voltage $V_C$ is then applied at the time $t_4$. Generally, one or more of the voltages $V_C$, $V_{M1}$, $V_{M2}$, $V_P$ is applied at a different time from others of the voltages $V_C$, $V_{M1}$, $V_{M2}$, $V_P$. During release of the voltages $V_C$, $V_{M1}$, $V_{M2}$, $V_P$, two or more of the voltages $V_C$, $V_{M1}$, $V_{M2}$, $V_P$ may be released at substantially the same time, while remaining of the voltages $V_C$, $V_{M1}$, $V_{M2}$, $V_P$ may be released at different times. In the example shown in FIG. 3D, the peripheral voltage $V_P$ is released at the time $t_{R1}$, the first and second middle voltages $V_{M1}$, $V_{M2}$ are released at the time $t_{R3}$, and the central voltage $V_C$ is released at the time $t_{R4}$.

FIG. 3D further illustrates that one or more of the voltage magnitudes of the voltages $V_C$, $V_{M1}$, $V_{M2}$, $V_P$ may be different from others of the voltage magnitudes of the voltages $V_C$, $V_{M1}$, $V_{M2}$, $V_P$. As shown in the example of FIG. 3D, the peripheral voltage $V_P$ has lesser magnitude than the second middle voltage $V_{M2}$, which has lesser magnitude than the first middle voltage $V_{M1}$, which has lesser magnitude than the central voltage $V_C$. By applying the voltages $V_C$, $V_{M1}$, $V_{M2}$, $V_P$ at different magnitudes, a finer degree of control for reducing stress concentration and friction may be achieved.

Figure 3E:
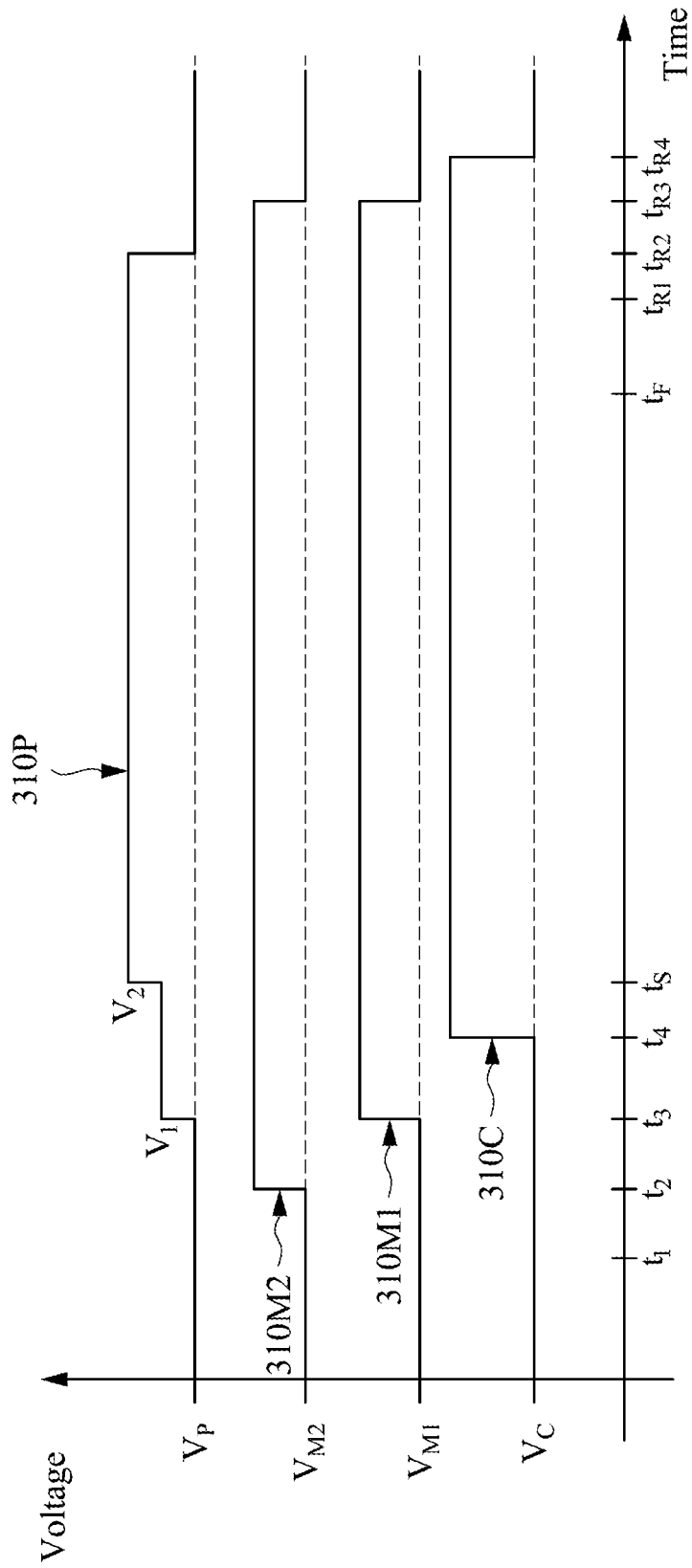

FIG. 3E illustrates application of one or more of the voltages $V_C$, $V_{M1}$, $V_{M2}$, $V_P$ having dynamic voltage magnitude. In the example shown in FIG. 3E, the peripheral voltage $V_P$ is initially applied at a first voltage level $V_1$, followed by the peripheral voltage $V_P$ increasing to a second voltage level $V_2$ greater than the first voltage level $V_1$. In some embodiments, the dynamic voltage magnitude may be set based on one or more measurements from the spectral and/or charge monitoring system 180 (or simply "the monitoring system 180"). For example, the monitoring system 180 may detect bending/warpage of the wafer 105 near the peripheral chuck region 250P of the electrostatic chuck 130. By increasing the peripheral voltage $V_P$ to the second voltage level $V_2$, the wafer 105 may be better flattened by the electrostatic chuck 130. In some embodiments, the peripheral voltage $V_P$ is increased or decreased following application of another of the voltages $V_C$, $V_{M1}$, $V_{M2}$. For example, in the example shown in FIG. 3E, the peripheral voltage $V_P$ is applied at the first voltage level $V_1$ initially at the time $t_3$, followed by application of the central voltage $V_C$ at the time $t_4$. Application of the central voltage $V_C$ may alter bending/warpage of the wafer 105 near the peripheral chuck region 250P at or shortly after the time $t_4$. As such, at a time following the time $t_4$ and prior to the start time is at which processing begins, the peripheral voltage $V_P$ may be increased to the second voltage level $V_2$ to improve flatness of the wafer 105 on the electrostatic chuck 130. In some embodiments, the peripheral voltage $V_P$ may be applied initially at the second voltage level $V_2$, then lowered to the first voltage level $V_1$ at a later time.

FIG. 3E further illustrates that one or more of the voltages $V_C$, $V_{M1}$, $V_{M2}$, $V_P$ may be different from others of the voltages $V_C$, $V_{M1}$, $V_{M2}$, $V_P$. In the example shown, all of the voltages $V_C$, $V_{M1}$, $V_{M2}$, $V_P$ are different from each other. In some embodiments, the voltages $V_C$, $V_{M1}$, $V_{M2}$, $V_P$ are progressively lower in magnitude from the center of the electrostatic chuck 130 outward. For example, as shown in FIG. 3E, the peripheral voltage $V_P$ has lower magnitude than the second middle voltage $V_{M2}$, which has lower magnitude than the first middle voltage $V_{M1}$, which has lower magnitude than the central voltage $V_C$. In some embodiments, the voltages $V_C$, $V_{M1}$, $V_{M2}$, $V_P$ are varied without following any particular gradient (e.g., center-to-peripheral, peripheral-to-center).

Figure 4A:
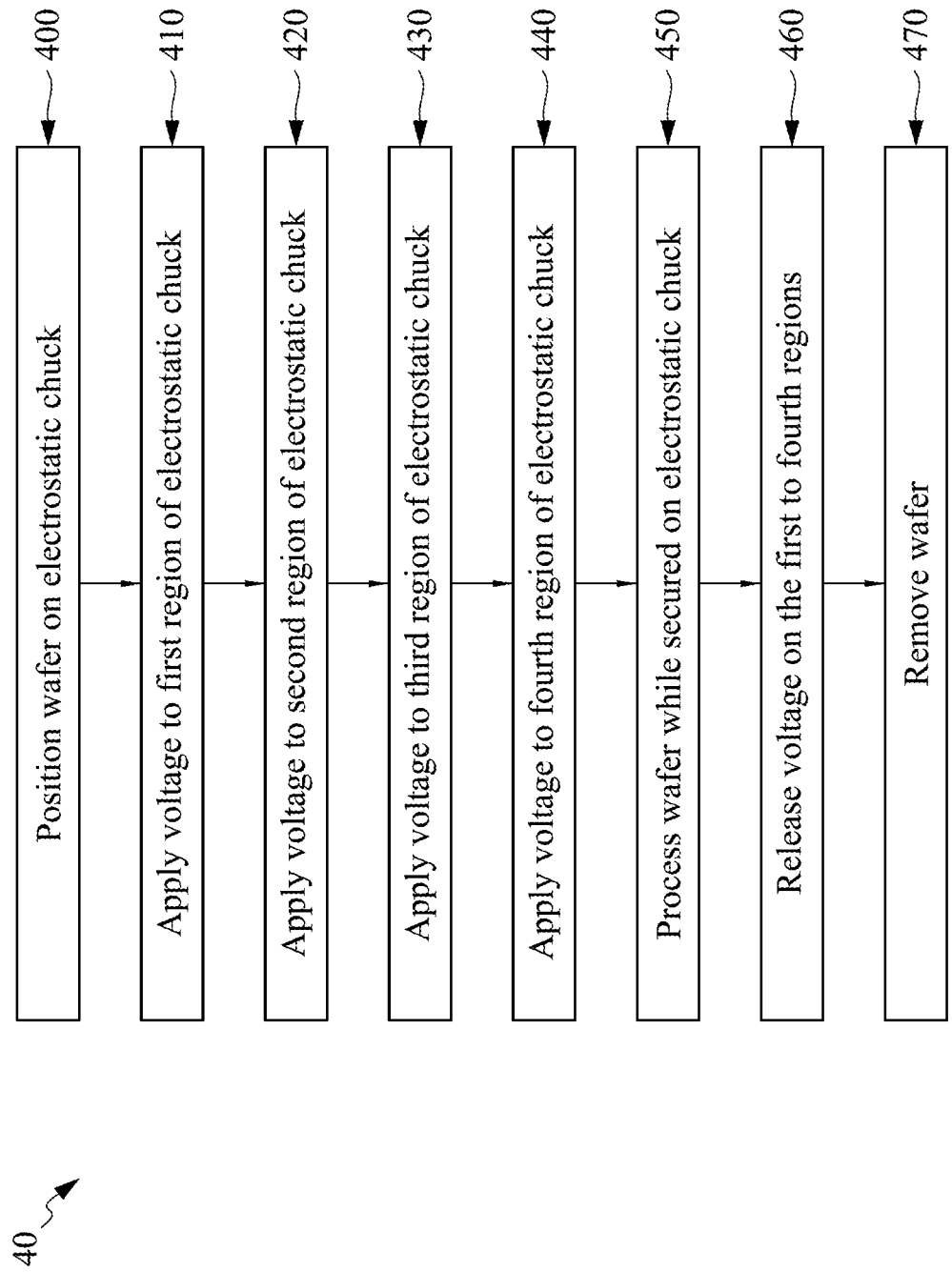
FIGS. 4A-4B are views illustrating methods of processing a wafer according to various aspects of the present disclosure.
Figure 4B:
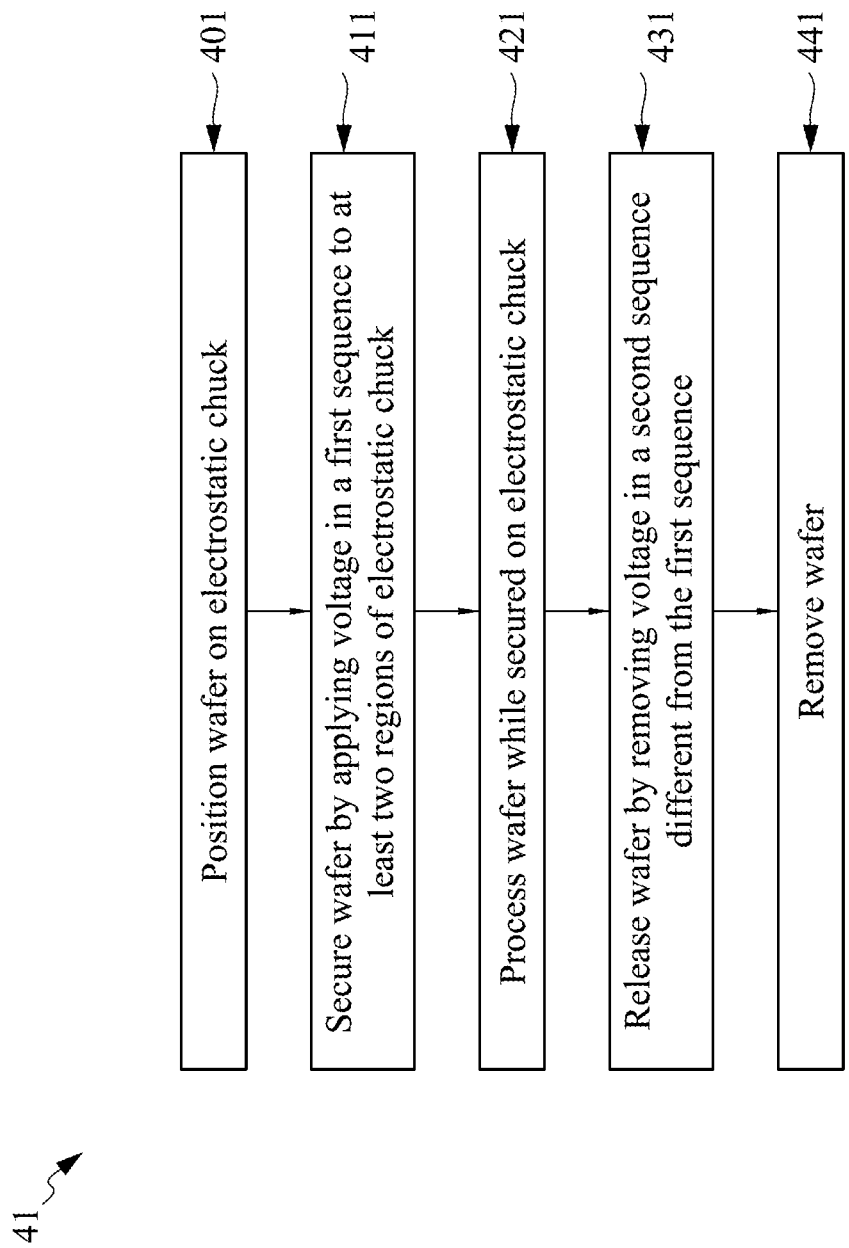

FIGS. 4A, 4B are views of processes 40, 41 for processing semiconductor wafers, such as the wafer 105, in accordance with various embodiments. It should be noted that the operations of the processes 40, 41 may be rearranged or otherwise modified within the scope of the various aspects. It should further be noted that additional processes may be provided before, during, and after the processes 40, 41, and that some other processes may be only briefly described herein. Embodiments of the processes 40, 41 may be described with reference to elements of FIGS. 1-3E for ease of illustration, however the processes 40, 41 may be used with other systems and elements thereof in other embodiments.

In FIG. 4A, the process 40 includes operations 400-470. A semiconductor wafer, such as the wafer 105, is positioned on an electrostatic chuck, such as the electrostatic chuck 130, in operation 400. The positioning may be performed by a robotic arm, which may transfer the wafer 105 from a FOUP to a staging area of the apparatus 100, and/or from the staging area to the chamber 110 of the apparatus 100.

Voltage, such as the central voltage $V_C$, is applied to a first region, such as the central region 250C, of the electrostatic chuck 130 in operation 410. In some embodiments, the voltage $V_C$ is applied to a chuck electrode located in the first region, such as by applying the voltage $V_C$ to the central chuck electrode 240C in the central region 250C. In some embodiments, the voltage $V_C$ is applied by a voltage driver circuit electrically connected to the central electrode 240C.

Voltage, such as the first middle voltage $V_{M1}$, is applied to a second region, such as the middle region 250M1, of the electrostatic chuck 130 in operation 420. In some embodiments, the voltage $V_{M1}$ is applied to a chuck electrode located in the second region, such as by applying the voltage $V_{M1}$ to the middle chuck electrode 240M1 in the middle region 250M1. In some embodiments, the voltage $V_{M1}$ is applied by the same voltage driver circuit that applies the voltage $V_C$. In some embodiments, the voltage $V_{M1}$ and the voltage $V_C$ are applied by different voltage driver circuits.

Voltage, such as the second middle voltage $V_{M2}$, is applied to a third region, such as the middle region 250M2, of the electrostatic chuck 130 in operation 430. In some embodiments, the voltage $V_{M2}$ is applied to a chuck electrode located in the third region, such as by applying the voltage $V_{M2}$ to the middle chuck electrode 240M2 in the middle region 250M2. In some embodiments, the voltage $V_{M2}$ is applied by the same voltage driver circuit that applies the voltages $V_C$, $V_{M1}$. In some embodiments, two or more of the voltages $V_C$, $V_{M1}$, $V_{M2}$ are applied by different voltage driver circuits.

Voltage, such as the peripheral voltage $V_P$, is applied to a fourth region, such as the peripheral region 250P, of the electrostatic chuck 130 in operation 440. In some embodiments, the voltage $V_P$ is applied to a chuck electrode located in the fourth region, such as by applying the voltage $V_P$ to the peripheral chuck electrode 240P in the peripheral region 250P. In some embodiments, the voltage $V_P$ is applied by the same voltage driver circuit that applies the voltages $V_C$, $V_{M1}$, $V_{M2}$. In some embodiments, two or more of the voltages $V_C$, $V_{M1}$, $V_{M2}$, $V_P$ are applied by different voltage driver circuits.

Embodiments of magnitudes and timing of application of the voltages in operations 410-440 are described with reference to FIGS. 3A-3E.

In operation 450, the wafer 105 is processed by the apparatus 100 while secured on the electrostatic chuck 130. In some embodiments, the processing includes one or more of etching, depositing, cleaning, annealing, or the like. By performing operations 410-440 prior to beginning processing by the apparatus 100 in operation 450, the wafer 105 may be secured flat over the surface of the electrostatic chuck 130, which reduces stress concentration and overlay errors.

Following processing of the wafer 105 in operation 450, the voltages on the first to fourth regions are released in operation 460. Embodiments of timing of release of the voltages in operation 450 are described with reference to FIGS. 3A-3E.

After releasing the voltages in operation 450, the wafer 105 may be removed from the chamber 110 and/or from the apparatus 100 in operation 470.

In FIG. 4B, the process 41 includes operations 401-441, as shown. In operation 401, a wafer is positioned on an electrostatic chuck. The operation 401 may be similar in many respects to the operation 400 of the process 40.

In operation 411, the wafer is secured on an electrostatic chuck by applying voltage in two or more regions of the electrostatic chuck. For example, the wafer 105 is secured on the electrostatic chuck 130 by applying the voltages $V_C$, $V_{M1}$, $V_{M2}$, $V_P$ in the regions 250C, 250M1, 250M2, 250P. In some embodiments, the wafer 105 is secured by applying the voltages $V_C$, $V_{M1}$, $V_{M2}$, $V_P$ in a first sequence. For example, as shown in FIG. 3A, the first sequence may include applying the voltage $V_C$, followed by the voltage $V_{M1}$, followed by the voltage $V_{M2}$, followed by the voltage $V_P$. Other embodiments of the first sequence, which may also be referred to as an "application sequence," are described and illustrated with reference to FIGS. 3A-3E above.

While the wafer 105 is secured on the electrostatic chuck 130, the wafer 105 is processed by the apparatus 100 in operation 421. Operation 421 may be similar in many respects to the operation 450 of the process 40.

Following the processing in operation 421, the wafer 105 is released in operation 431 from the electrostatic chuck 130 by removing the voltages in a second sequence different from the first sequence. Embodiments of the second sequence, which may also be referred to as a "release sequence," are described and illustrated with reference to FIGS. 3A-3E above. In FIG. 3A, for example, the second sequence includes removing the voltages $V_C$, $V_{M1}$, $V_{M2}$, $V_P$ substantially simultaneously. In some other embodiments, the release sequence may be the same as the application sequence to form other processes.

Following releasing the wafer 105 in operation 431, the wafer 105 is removed from the chamber 110 in operation 441. Operation 441 may be similar in many respects to operation 470 of process 40.

Figure 5:
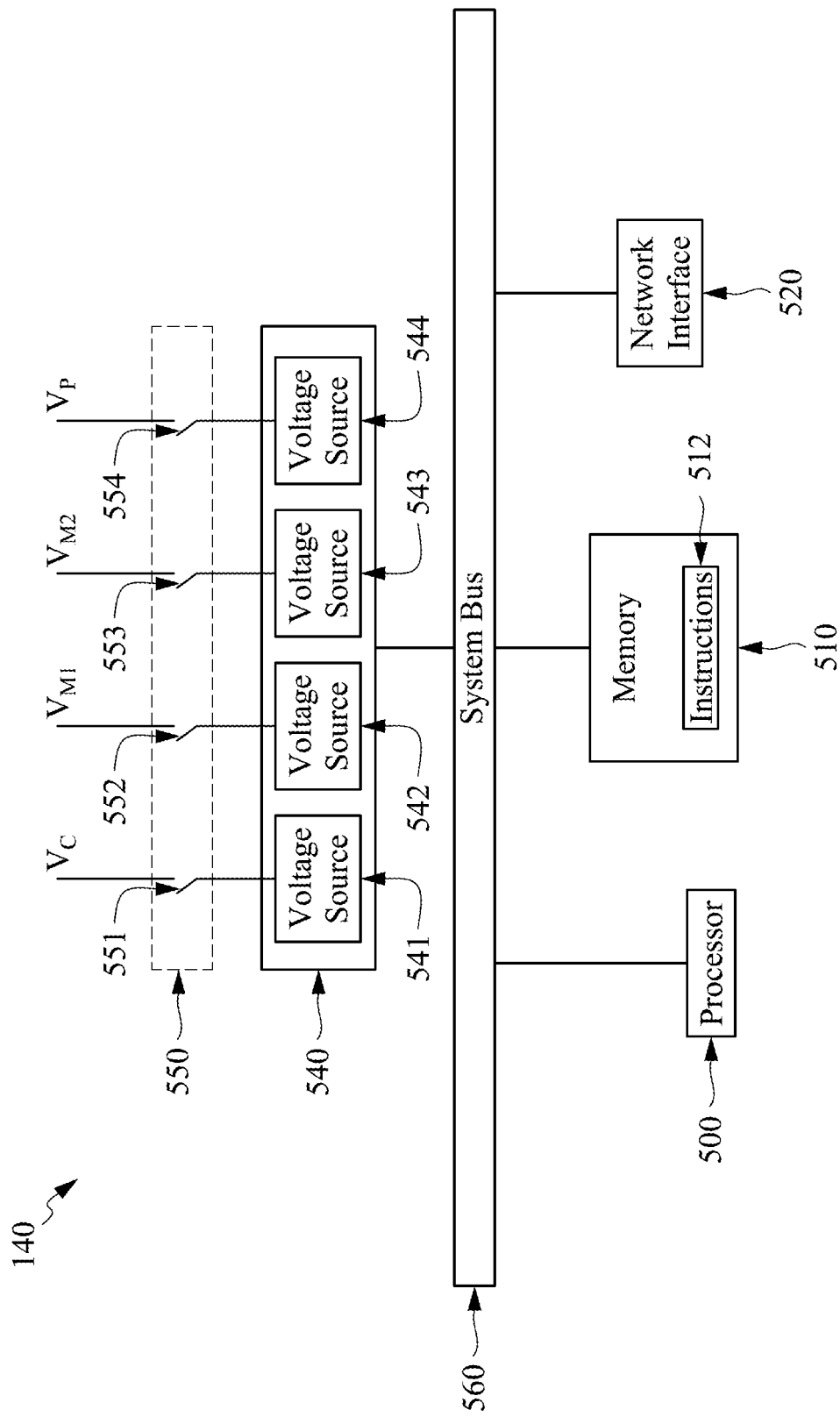
FIGS. 5-6 are views illustrating control systems in accordance with various embodiments.

FIG. 5 is a schematic diagram of the source of DC voltage 140 in accordance with various embodiments. The source of DC voltage 140 generates the voltages $V_C$, $V_{M1}$, $V_{M2}$, $V_P$ for controlling operation of the electrostatic chuck 130. The source of DC voltage 140 may receive input signals from the controller 60.

The source of DC voltage 140 includes a processor 500, a memory 510, and a network interface 520 each coupled via a system bus 560 or other data communication mechanism. The source of DC voltage 140 further includes a voltage supply 540 for generating the voltages $V_C$, $V_{M1}$, $V_{M2}$, $V_P$ for controlling operation of the electrostatic chuck 130. In some embodiments, the source of DC voltage 140 includes a switching module 550 for controlling application and removal of the voltages $V_C$, $V_{M1}$, $V_{M2}$, $V_P$ to/from the securing electrodes 240.

The voltage supply 540 includes one or more voltage sources 541-544. In some embodiments, the number of voltage sources 541-544 is the same as the number of voltages $V_C$, $V_{M1}$, $V_{M2}$, $V_P$ and the number of the securing electrodes 240. Each voltage source of the voltage sources 541-544 may include one or more circuit components, such as transistors, resistors, capacitors, inductors, diodes, or the like, arranged in an appropriate manner to output the voltages $V_C$, $V_{M1}$, $V_{M2}$, $V_P$. The voltage sources 541-544 may be fixed-output voltage sources configured to output a voltage that does not change substantially based on any input to the voltage sources 541-544, or may be variable-output voltage sources configured to output a voltage that can vary based on one or more inputs to the voltage sources 541-544. Generally, the voltage sources 541-544 are configured to output four voltages that may have the same or different magnitude, as described above with reference to FIGS. 3A-3E. Each of the voltage sources 541-544 may be configured to output a high voltage (e.g., 1 kV to 9 kV) in a first operating mode (e.g., an ON mode) and a low voltage (e.g., ground, 0 Volts) in a second operating mode (e.g., an OFF mode). The voltage source 541 may output the voltage $V_C$, the voltage source 542 may output the voltage $V_{M1}$, the voltage source 543 may output the voltage $V_{M2}$, and the voltage source 544 may output the voltage $V_P$.

The switching module 550, when present, may include switches 551-554. In some embodiments, the number of the switches 551-554 is the same as the number of voltages $V_C$, $V_{M1}$, $V_{M2}$, $V_P$, the number of the securing electrodes 240 and the number of the voltage sources 541-544. The switch 551 may be electrically connected to the voltage source 541 and the securing electrode 240C. The switch 552 may be electrically connected to the voltage source 542 and the securing electrode 240M1. The switch 553 may be electrically connected to the voltage source 543 and the securing electrode 240M2. The switch 554 may be electrically connected to the voltage source 544 and the securing electrode 240P. The switches 551-554 may be operated independently or as a group to enable or disable transmission of the voltages $V_C$, $V_{M1}$, $V_{M2}$, $V_P$ to the securing electrodes 240C, 240M1, 240M2, 240P, respectively. In some embodiments, each of the switches 551-554 is or comprises one or more transistors, such as a metal-oxide-semiconductor field effect transistor (MOSFET), having a gate electrode for receiving control signals over the system bus 560, and drain/source electrodes electrically connected to one of the voltage sources 541-544 and one of the securing electrodes 240.

The processor 500 is arranged to execute and/or interpret one or more set of instructions 512 stored in the memory 510. In some embodiments, the processor 500 is a central processing unit (CPU), a multi-processor, a distributed processing system, an application specific integrated circuit (ASIC), a microprocessor unit (MPU) and/or other suitable processing unit.

The memory 510 (also referred to as a computer-readable medium) includes a random access memory or other dynamic storage device, which may be coupled to the system bus 560 for storing data and/or instructions (e.g., the instructions 512) for execution by the processor 500. In some embodiments, the memory 510 is used for storing temporary variables or other intermediate information during execution of instructions to be executed by the processor 500. In some embodiments, the memory 510 includes a read-only memory or other static storage device coupled to the system bus 560 for storing static information and instructions (e.g., the instruction 512) for the processor 500. In some embodiments, the memory 510 is or includes one or more of electronic, magnetic, optical, electromagnetic, infrared, and semiconductor memory. For example, the memory 510 may be or include one or more of a semiconductor or solid-state memory, a magnetic tape, a removable computer diskette, a random access memory (RAM), a read-only memory (ROM), a rigid magnetic disk, and/or an optical disk. In some embodiments using optical disks, the memory 510 includes a compact disk-read only memory (CD-ROM), a compact disk-read/write (CD-R/W), and/or a digital video disc (DVD).

The memory 510 may be encoded with computer program code, which is or includes a set of executable instructions 512, for controlling one or more of the voltage supply 540 and the switching module 550. In some embodiments, the memory 510 includes the instructions 512 for causing the source of DC voltage 140 to perform operations 410-440, 460 of process 40 and/or operations 411, 431 of process 41. In some embodiments, the memory 510 also stores information needed for performing the processes 40, 41 as well as information generated during performing the processes 40, 41.

The network interface 520 includes devices for connecting to a network, to which one or more other computer systems, such as the controller 60, are connected. In some embodiments, the network interface 520 includes one or more of a wired and/or wireless connection device. The network interface 520 may include wireless network interfaces, such as BLUETOOTH, WIFI, WIMAX, GPRS, or WCDMA; or wired network interface such as ETHERNET, USB, or IEEE-1394. In some embodiments, the source of DC voltage 140 is coupled with the controller 60 via the network interface 520.

Figure 6:
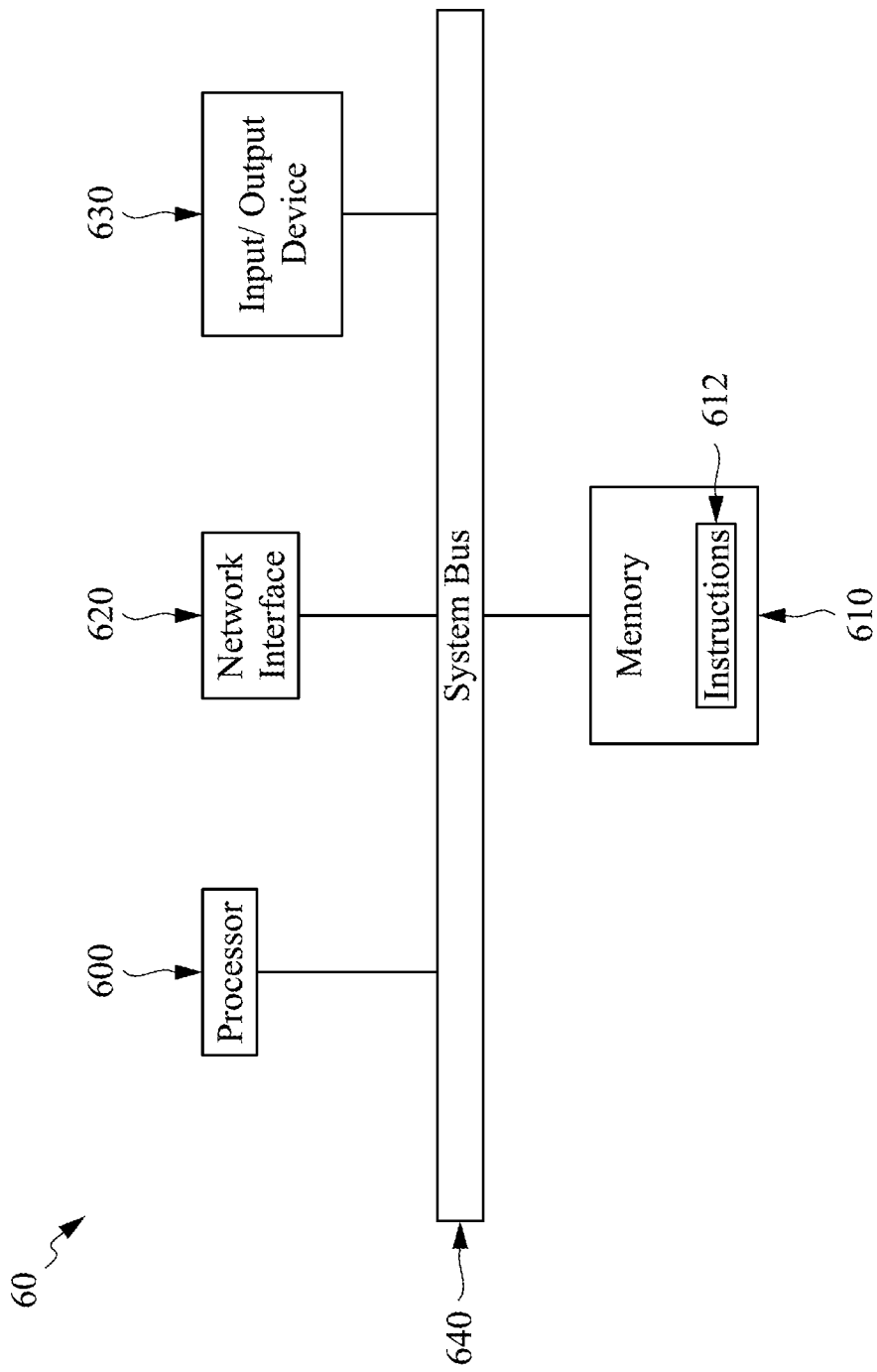

FIG. 6 is a schematic diagram of a controller 60, in accordance with some embodiments. The controller 60 generates output control signals for controlling operations of one or more components of the source of RF power 120, the source of DC power 140, the pump 160, the spectral and/or charge monitoring system 180, the gas source 310 and the flow verification unit 320. The controller 60 receives input signals from one or more of the spectral and/or charge monitoring system 180 and the flow verification unit 320.

The controller 60 includes a processor 600, an input/output (I/O) device 630, a memory 610, and a network interface 620 each coupled via a system bus 640 or other communication mechanism.

The processor 600 is arranged to execute and/or interpret one or more set of instructions 612 stored in the memory

610. In some embodiments, the processor 600 is or includes one or more of a central processing unit (CPU), a microprocessor unit (MPU), a multi-processor, a distributed processing system, an application specific integrated circuit (ASIC), and other suitable processing unit.

The I/O device 630 may be coupled to external circuitry. In some embodiments, the I/O device 630 includes a keyboard, keypad, mouse, trackball, trackpad, touch screen and/or cursor direction keys for communicating information and commands to the processor 600. Generally, the I/O device 630 receives input (e.g., key presses) from a human user who operates the I/O device 630.

The memory 610 (also referred to as a computer-readable medium) includes a random access memory or other dynamic storage device, communicatively coupled to the system bus 640 for storing data and/or instructions (e.g., the instructions 612) for execution by the processor 600. In some embodiments, the memory 610 is used for storing temporary variables or other intermediate information during execution of instructions (e.g., the instructions 612) to be executed by the processor 600. In some embodiments, the memory 610 also includes a read-only memory or other static storage device coupled to the system bus 640 for storing static information and instructions (e.g., the instructions 612) for the processor 600. In some embodiments, the memory 610 is or includes one or more of an electronic, magnetic, optical, electromagnetic, infrared, and semiconductor memory. For example, the memory 610 may include a semiconductor or solid-state memory, a magnetic tape, a removable computer diskette, a random access memory (RAM), a read-only memory (ROM), a rigid magnetic disk, and/or an optical disk. In some embodiments using optical disks, the memory 610 includes a compact disk-read only memory (CD-ROM), a compact disk-read/write (CD-R/W), and/or a digital video disc (DVD).

The memory 610 is encoded with computer program code, such as a set of executable instructions 612, for controlling one or more components of the source of RF power 120, the source of DC power 140, the pump 160, the spectral and/or charge monitoring system 180, the gas source 310 and the flow verification unit 320, and causing the controller 60 to perform the processes 40, 41. In some embodiments, the memory 610 also stores information needed for performing the processes 40, 41 as well as information generated during performing the processes 40, 41.

The network interface 620 includes a mechanism for connecting to a network, to which one or more other computer systems may be connected. In some embodiments, the network interface 620 includes a wired and/or wireless connection mechanism. The network interface 620 may include one or more wireless network interfaces, such as BLUETOOTH, WIFI, WIMAX, GPRS, or WCDMA; and may include one or more wired network interfaces, such as ETHERNET, USB, or IEEE-1394. In some embodiments, the controller 60 is coupled with one or more components of the semiconductor processing apparatus 100 via the network interface 620.

Embodiments may provide advantages. By securing the wafer 105 on the electrostatic chuck 130 in at least two stages, the wafer 105 can be fully extended on the electrostatic chuck 130, reducing stress concentration and contamination.

In accordance with at least one embodiment, a method includes: positioning a wafer on an electrostatic chuck of an apparatus; and securing the wafer to the electrostatic chuck by: securing a first wafer region of the wafer to a first chuck region of the electrostatic chuck by applying a first voltage at a first time. The method further includes securing a second wafer region of the wafer to a second chuck region of the electrostatic chuck by applying a second voltage at a second time different from the first time; and processing the wafer by the apparatus while the wafer is secured to the electrostatic chuck.

In accordance with at least one embodiment, a method comprises securing a wafer to an electrostatic chuck of an apparatus by applying voltages to at least two chuck regions of the electrostatic chuck in a first sequence; processing the wafer while the wafer is secured to the electrostatic chuck; and releasing the wafer from the electrostatic chuck by removing the voltages from the at least two chuck regions in a second sequence different from the first sequence.

In accordance with at least one embodiment, a method includes positioning a wafer in a chamber on an electrostatic chuck; applying a first voltage to a central chuck electrode of the electrostatic chuck; applying a second voltage having the same polarity as the first voltage to a peripheral chuck electrode of the electrostatic chuck at a different time from the applying the first voltage; processing the wafer in the chamber when the central chuck electrode is at substantially the first voltage and the peripheral chuck electrode is at substantially the second voltage; removing the first voltage and the second voltage after the processing; and removing the wafer from the chamber after the removing the first and second voltages.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   positioning a wafer on an electrostatic chuck of an apparatus;
   securing the wafer to the electrostatic chuck by:
      securing a first wafer region of the wafer to a first chuck region of the electrostatic chuck by applying a first voltage at a first time; and
      securing a second wafer region of the wafer to a second chuck region of the electrostatic chuck by applying a second voltage at a second time that follows the first time, wherein the second time is during a period in which a first chuck electrode of the first chuck region is partially charged to a voltage level that is less than a voltage level of the first voltage; and
   processing the wafer by the apparatus while the wafer is secured to the electrostatic chuck.

2. The method of claim 1, wherein the securing the wafer further includes:
   securing a third wafer region of the wafer to a third chuck region of the electrostatic chuck by applying a third voltage at a third time different from the first and second times; and securing a fourth wafer region of the wafer to a fourth chuck region of the electrostatic chuck by applying a fourth voltage at a fourth time different from the first, second and third times.

3. The method of claim 1, wherein the second time follows the first time by less than 0.5 seconds.

4. The method of claim 1, wherein the second time is during a period in which a first chuck electrode of the first chuck region is partially charged to a voltage level that equals half of the voltage level of the first voltage.

5. The method of claim 1, wherein the first voltage has greater magnitude than the second voltage.

6. The method of claim 1, wherein:
the first chuck region is a central chuck region;
the second chuck region is a peripheral chuck region; and
the securing the wafer further includes:
securing a middle wafer region between the central chuck region and the peripheral chuck region by applying a third voltage at a third time after the first time and before the second time.

7. The method of claim 6, wherein the applying the first voltage includes:
applying the first voltage at a first level at the first time; and
applying the first voltage at a second level greater than the first level between the third time and the second time.

8. A method, comprising:
securing a wafer to an electrostatic chuck of an apparatus by applying voltages to at least two chuck regions of the electrostatic chuck in a first sequence;
processing the wafer while the wafer is secured to the electrostatic chuck; and
releasing the wafer from the electrostatic chuck by removing the voltages from the at least two chuck regions in a second sequence different from the first sequence, wherein each of the voltages removed in the second sequence is removed at a different time.

9. The method of claim 8, wherein the first sequence includes a central chuck region followed by a peripheral chuck region.

10. The method of claim 9, wherein the second sequence includes the central chuck region substantially simultaneous with the peripheral chuck region.

11. The method of claim 8, wherein the first sequence is determined based on warpage of the wafer.

12. The method of claim 11, wherein each of the voltages applied in the first sequence is applied at a different time.

13. The method of claim 8, wherein securing a wafer to the electrostatic chuck of the apparatus by applying voltages to at least two chuck regions of the electrostatic chuck in the first sequence comprises securing the wafer to the electrostatic chuck of the apparatus by applying voltages to at least four chuck regions of the electrostatic chuck in the first sequence.

14. A method, comprising:
positioning a wafer in a chamber on an electrostatic chuck;
applying a first voltage to a central chuck electrode of the electrostatic chuck;
applying a second voltage having the same polarity as the first voltage to a peripheral chuck electrode of the electrostatic chuck at a different time from the applying the first voltage;
processing the wafer in the chamber when the central chuck electrode is at substantially the first voltage and the peripheral chuck electrode is at substantially the second voltage;
removing the first voltage and the second voltage after the processing, wherein the first voltage is removed at a different time than the second voltage; and
removing the wafer from the chamber after the removing the first and second voltages.

15. The method of claim 14, wherein the central chuck electrode is a first stripe-shaped electrode and the peripheral chuck electrode is a second stripe-shaped electrode laterally offset from the central chuck electrode.

16. The method of claim 14, wherein the central chuck electrode is offset from a wafer-facing surface of the electrostatic chuck by a different distance than the peripheral chuck electrode.

17. The method of claim 14, further comprising:
heating the electrostatic chuck by applying a third voltage to at least one heating electrode of the electrostatic chuck.

18. The method of claim 17, wherein the at least one heating electrode is offset from a wafer-facing surface of the electrostatic chuck by a different distance than the central chuck electrode and the peripheral chuck electrode.

19. The method of claim 14, further comprising:
applying a third voltage to a middle chuck electrode of the electrostatic chuck located between the central chuck electrode and the peripheral chuck electrode.

20. The method of claim 14, wherein the processing includes etching, depositing, implantation, annealing or cleaning.

* * * * *